(12) United States Patent
Jang et al.

(10) Patent No.: US 11,296,267 B2
(45) Date of Patent: Apr. 5, 2022

(54) DISPLAY DEVICE

(71) Applicant: Samsung Display Co., Ltd., Yongin-si (KR)

(72) Inventors: Donghyeon Jang, Suwon-si (KR); Hyunae Park, Hwaseong-si (KR); Seungwoo Sung, Cheonan-si (KR); Nuree Um, Hwaseong-si (KR); Young-soo Yoon, Seoul (KR); Ilgoo Youn, Asan-si (KR); Ji-eun Lee, Seoul (KR); Yun-kyeong In, Hwaseong-si (KR); Seunghan Jo, Seoul (KR); Junyoung Jo, Suwon-si (KR)

(73) Assignee: Samsung Display Co., Ltd., Yongin-si (KR)

(*) Notice: Subject to any disclaimer, the term of this patent is extended or adjusted under 35 U.S.C. 154(b) by 119 days.

(21) Appl. No.: 16/698,943

(22) Filed: Nov. 27, 2019

(65) Prior Publication Data

US 2020/0176657 A1 Jun. 4, 2020

(30) Foreign Application Priority Data

Nov. 29, 2018 (KR) .................. 10-2018-0150963

(51) Int. Cl.
*H01L 33/62* (2010.01)
*G06F 1/16* (2006.01)
*H01L 25/075* (2006.01)

(52) U.S. Cl.
CPC ............ *H01L 33/62* (2013.01); *G06F 1/1626* (2013.01); *H01L 25/0753* (2013.01)

(58) Field of Classification Search
None
See application file for complete search history.

(56) References Cited

U.S. PATENT DOCUMENTS

| | | | |
|---|---|---|---|
| 2017/0154566 A1* | 6/2017 | Ryoo | ................... G09G 3/3648 |
| 2017/0287992 A1 | 10/2017 | Kwak et al. | |
| 2017/0294502 A1* | 10/2017 | Ka | ....................... H01L 27/3276 |
| 2018/0114482 A1 | 4/2018 | Jung | |
| 2018/0151660 A1 | 5/2018 | Kim et al. | |

(Continued)

FOREIGN PATENT DOCUMENTS

| | | |
|---|---|---|
| EP | 3176771 | 6/2017 |
| EP | 3261142 | 12/2017 |

(Continued)

*Primary Examiner* — Su C Kim
(74) *Attorney, Agent, or Firm* — H.C. Park & Associates, PLC

(57) ABSTRACT

A display device includes: a base layer including a first region in which a hole is defined, a second region surrounding the first region, and a third region surrounding the second region; a line part disposed on the second region and including first, second, third, and fourth lines disposed on different layers from each other; pixels disposed on the third region; first signal lines electrically connected to the pixels and arrayed along a first direction; and second signal lines electrically connected to the pixels and arrayed along a second direction, wherein one second signal line is electrically connected to the first line, another second signal line is electrically connected to the second line, one first signal line is electrically connected to the third line, and another first signal line is electrically connected to the fourth line.

22 Claims, 24 Drawing Sheets

(56) References Cited

U.S. PATENT DOCUMENTS

2018/0157362 A1    6/2018  Kim et al.
2019/0051670 A1*  2/2019  Bei ..................... H01L 27/3276
2020/0044006 A1    2/2020  Lee et al.

FOREIGN PATENT DOCUMENTS

| | | |
|---|---|---|
| KR | 10-2017-0111827 | 10/2017 |
| KR | 10-2017-0113066 | 10/2017 |
| KR | 10-2018-0063633 | 6/2018 |
| KR | 10-2020-0015868 | 2/2020 |

\* cited by examiner

DISPLAY DEVICE

CROSS-REFERENCE TO RELATED APPLICATIONS

This application claims priority from and the benefit of Korean Patent Application No. 10-2018-0150963, filed on Nov. 29, 2018, which is hereby incorporated by reference for all purposes as if fully set forth herein.

BACKGROUND

Field

Exemplary implementations of the invention relate generally to a display device, and, more specifically, to a display device including electronic module with improved sensing sensitivity and display quality.

Discussion of the Background

A display device may be a device configured from various electronic components such as a display panel that displays an image, an input sensing member that senses an external input, an electronic module, and the like. The electronic components may be electrically connected with each other through signal lines arrayed in various ways. The display panel includes a light emitting element that generates a light. The input sensing member may include sensing electrodes for sensing an external input. The electronic module may include a camera, an infrared sensing sensor, a proximity sensor or the like. The electronic module may be disposed under the display panel.

The above information disclosed in this Background section is only for understanding of the background of the inventive concepts, and, therefore, it may contain information that does not constitute prior art.

SUMMARY

Devices constructed according to exemplary implementations of the invention provide a display device including an electronic module having improved sensing sensitivity and improved display quality.

Additional features of the inventive concepts will be set forth in the description which follows, and in part will be apparent from the description, or may be learned by practice of the inventive concepts.

According to one or more exemplary embodiments of the invention, a display device includes: a base layer including a first region in which a hole is defined, a second region configured to surround the first region, and a third region configured to surround the second region; a line part disposed on the second region and including a first line, a second line, a third line, and a fourth line disposed on different layers from each other; pixels disposed on the third region; first signal lines electrically connected to the pixels and arrayed along a first direction; and second signal lines electrically connected to the pixels and arrayed along a second direction that intersects with the first direction, wherein one second signal line of the second signal lines is electrically connected to the first line, another second signal line of the second signal lines is electrically connected to the second line, one first signal line of the first signal lines is electrically connected to the third line, and another first signal line of the first signal lines is electrically connected to the fourth line.

The display device may further include: a first insulation layer disposed between the first line and the second line; a second insulation layer disposed between the second line and the third line; and a third insulation layer disposed between the third line and the fourth line, wherein the first line, the first insulation layer, the second line, the second insulation layer, the third line, the third insulation layer, and the fourth line are sequentially disposed on the base layer.

Each of the pixels may include: a transistor including a control electrode disposed on an identical layer on which the first line is disposed, and an output electrode and an input electrode disposed on an identical layer on which the third line is disposed; a connection electrode disposed on an identical layer on which the fourth line is disposed; and a light emitting element electrically connected to the connection electrode.

In a planar view, the first line and the second line may not overlap, and the third line and the fourth line may not overlap.

The second line may be disposed between a layer on which the first line is disposed and a layer on which the third line is disposed, and the third line may be disposed between a layer on which the second line is disposed and a layer on which the fourth line is disposed.

In the planar view, the first, second, third, and fourth lines may be repeatedly arranged in a sequence of the first line, the third line, the second line, and the fourth line.

In the planar view, a part of the third line may overlap a part of the first line, and another part of the third line may overlap a part of the second line.

In the planar view, a part of the fourth line may overlap another part of the first line, and another part of the fourth line may overlap another part of the second line.

In the planar view, the third line may overlap one of the first line and the second line, and the fourth line may overlap the other one of the first line and the second line.

In the planar view, the first, second, third, and fourth lines may be repeatedly arranged in a sequence of the second line, the third line, the first line, and the fourth line.

The first region may include a plurality of first regions, each of the plurality of first regions being disposed separately, and the second region may surround the plurality of first regions.

The display device may further include: non-light emitting pixels disposed on the second region between the plurality of first regions.

According to one or more exemplary embodiments of the invention, a display device includes: a base layer including a first region in which a hole is defined, a second region configured to surround the first region, and a third region configured to surround the second region; pixels disposed on the third region; first signal lines electrically connected to the pixels; second signal lines electrically connected to the pixels; a first line disposed on the second region and electrically connected to one second signal line of the second signal lines; a second line disposed on the second region and electrically connected to another second signal line of the second signal lines; a third line disposed on the second region and electrically connected to one first signal line of the first signal lines; and a fourth line disposed on the second region and electrically connected to another first signal line of the first signal lines, wherein the first line, the second line, the third line, and the fourth line are disposed on different layers, and wherein the second line is disposed on a layer between the first line and the third line, the third line is disposed on a layer between the second line and the fourth line, and, in a planar view, the first line does not overlap the second line, and the third line does not overlap the fourth line.

In a planar view, the first, second, third, and fourth lines are repeatedly arranged in a sequence of the first line, the third line, the second line, and the fourth line.

In the planar view, a part of the third line may overlap a part of the first line, and another part of the third line may overlap a part of the second line, and in the planar view, a part of the fourth line may overlap another part of the first line, and another part of the fourth line may overlap another part of the second line.

In the planar view, the third line may overlap one of the first line and the second line, and the fourth line may overlap the other one of the first line and the second line.

The base layer, the pixels, the first signal lines, the second signal lines, and the first, second, third, and fourth lines may constitute a display module, the display module including: a first module region defined to overlap the first region, a second module region defined to overlap the second region, and a third module region defined to overlap the third region, and transmittance of the first module region may be higher than transmittance of the third module region.

According to one or more exemplary embodiments of the invention, a display device includes: a display panel in which a non-display region and a display region configured to surround the non-display region are defined, the display panel including: a base layer in which a hole is defined in a region configured to correspond to the non-display region; a line part disposed on a peripheral region of the hole of the base layer, the line part including a first line, a second line, a third line, and a fourth line disposed on different layers from each other; and a pixel electrically connected to the line part, wherein, in a planar view, the first line and the second line do not overlap, and the third line and the fourth line do not overlap.

The second line may be disposed between a layer on which the first line is disposed and a layer on which the third line is disposed, and the third line may be disposed between a layer on which the second line is disposed and a layer on which the fourth line is disposed.

In the planar view, a part of the third line may overlap a part of the first line, and another part of the third line may overlap a part of the second line, and in the planar view, a part of the fourth line may overlap another part of the first line, and another part of the fourth line may overlap another part of the second line.

According to one or more exemplary embodiments of the invention, a display device includes: a display panel including a non-display region and a display region configured to surround the non-display region, the non-display region including a first region in which a hole is defined and a second region configured to surround the first region, the display panel including: a line part disposed in the second region and including first line parts and second line parts disposed on different layers from each other; pixels disposed in the display region; first signal lines disposed in the display region, the first signal lines arrayed along a first direction, and the first signal lines electrically connected to the pixels and the first line parts, and second signal lines disposed in the display region, the second signal lines arrayed along a second direction that intersects with the first direction, and the second signal lines electrically connected to the pixels and the second line parts, wherein, in a planar view, the first line parts are disposed in a region between the second line parts.

The first line parts may include a first line and a second line disposed on different layers from each other, and the second line parts may include a third line and a fourth line disposed on different layers from each other.

The third line may be disposed on a layer between the second line and the fourth line.

It is to be understood that both the foregoing general description and the following detailed description are exemplary and explanatory and are intended to provide further explanation of the invention as claimed.

BRIEF DESCRIPTION OF THE FIGURES

The accompanying drawings, which are included to provide a further understanding of the inventive concepts, and are incorporated in and constitute a part of this specification. The drawings illustrate exemplary embodiments of the inventive concepts and, together with the description, serve to explain principles of the inventive concepts.

DETAILED DESCRIPTION

Figure 1A:
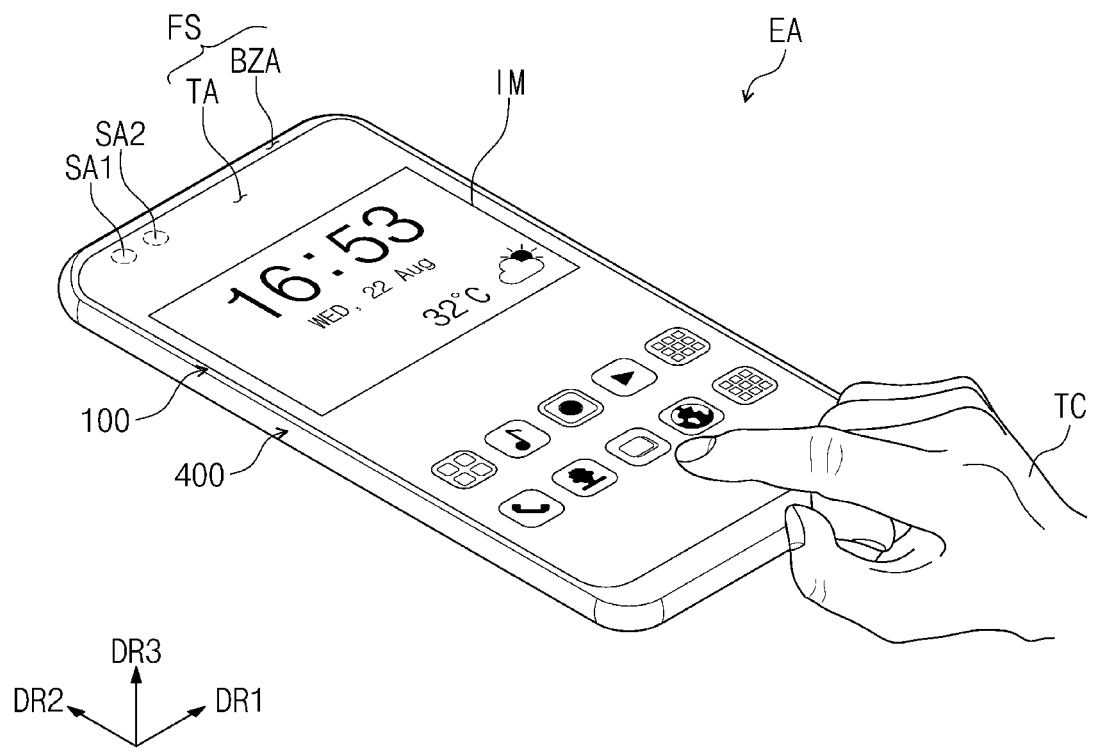
FIG. 1A is a perspective view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, a DR1-axis, a DR2-axis, and a DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments will be described with reference to the accompanying drawings.

Figure 1B:
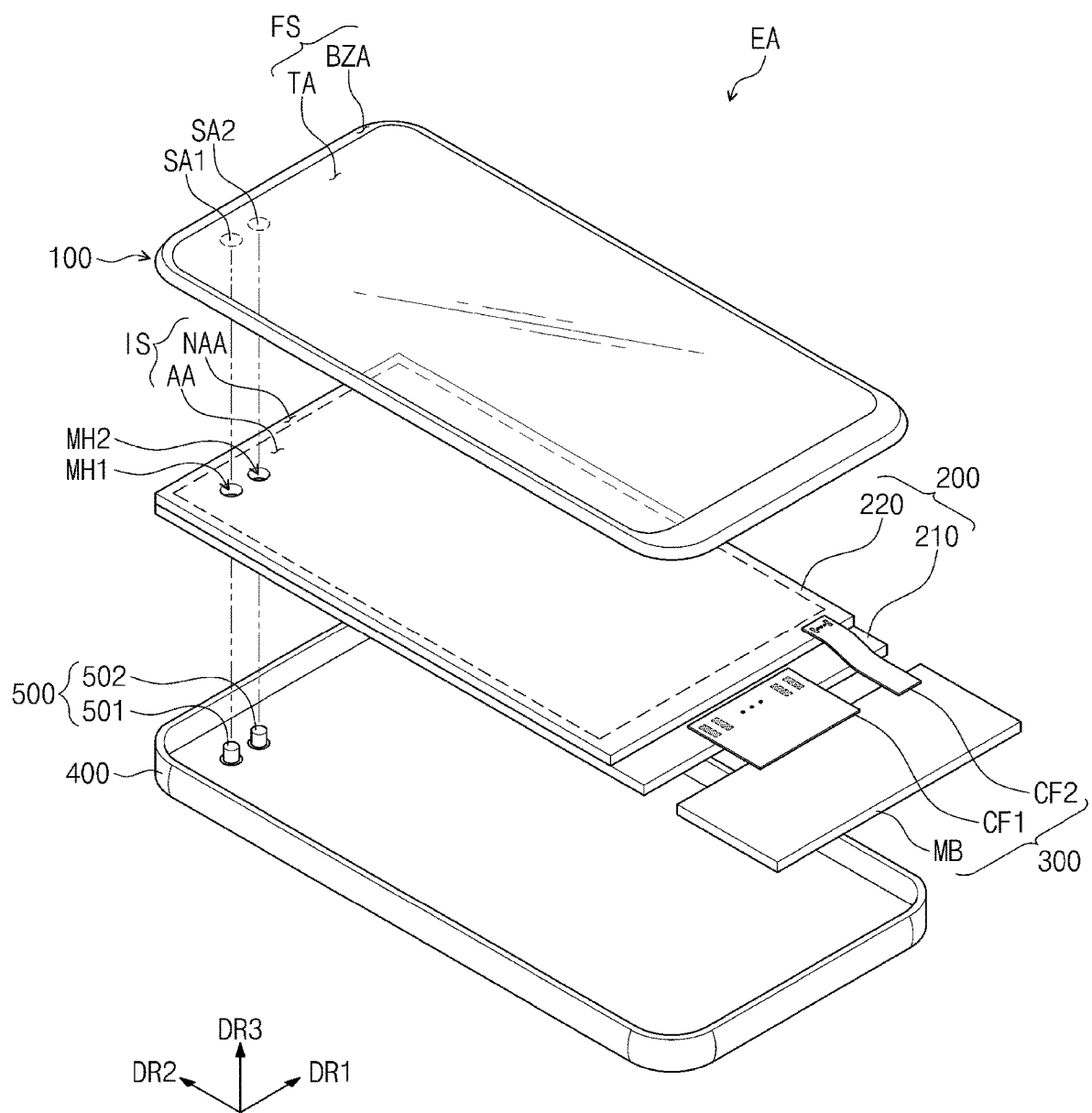
FIG. 1B is an exploded perspective view of a display device according to an exemplary embodiment.
Figure 2:
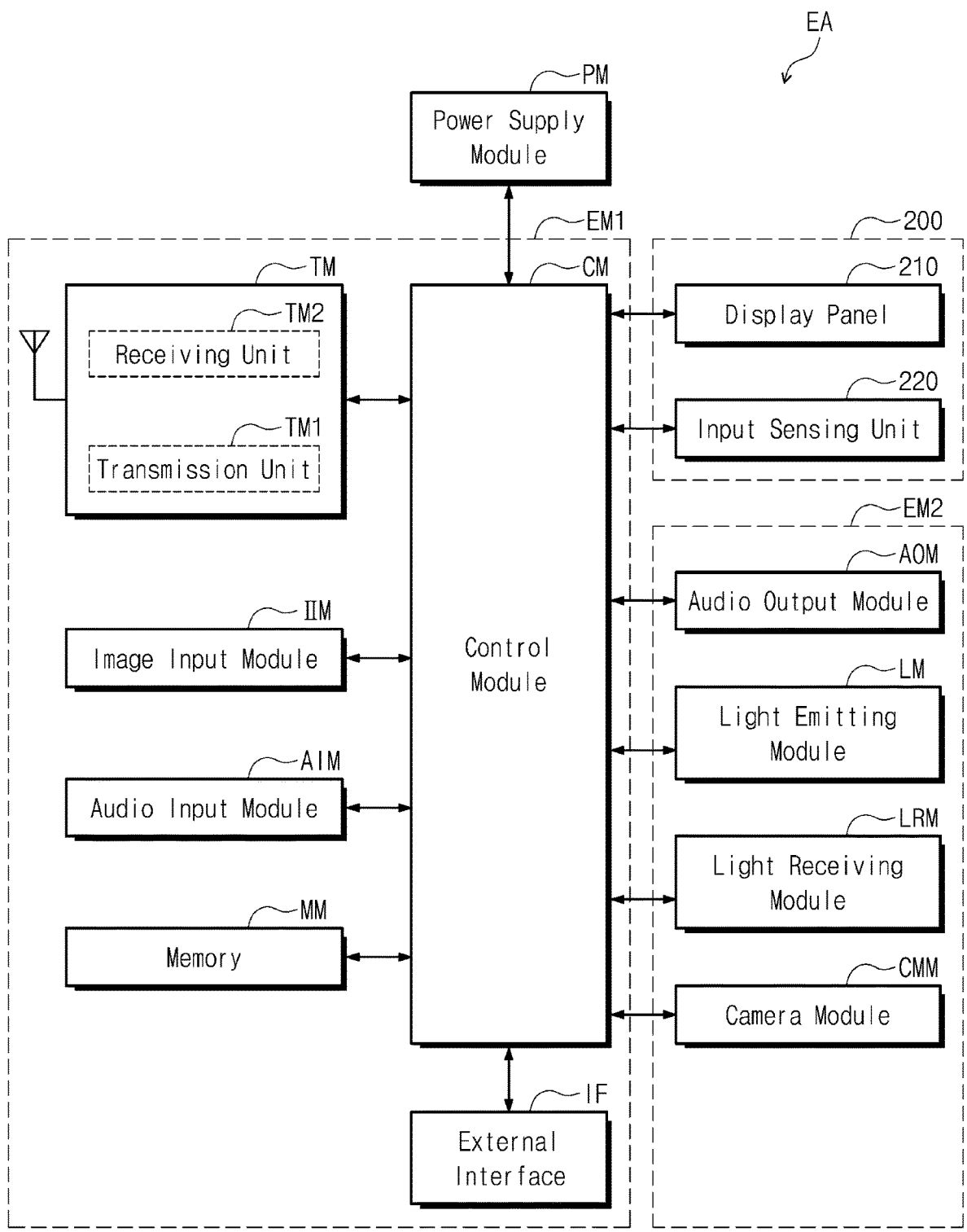
FIG. 2 is a block diagram of a display device according to an exemplary embodiment.

FIG. 1A is a perspective view of a display device according to an exemplary embodiment. FIG. 1B is an exploded perspective view of a display device according to an exemplary embodiment. FIG. 2 is a block diagram of a display device according to an exemplary embodiment. Hereinafter, the exemplary embodiments will be described with reference to FIGS. 1A, 1B, and 2.

A display device EA may be a device activated according to an electrical signal. The display device EA may include various embodiments. For example, the display device EA may include a tablet, a notebook computer, a computer, or a television, etc. According to the exemplary embodiment, the display device EA is exemplarily illustrated as a smartphone.

A display device EA may display an image IM on a display surface FS parallel to a first direction DR1 and a second direction DR2 towards a third direction DR3. The display surface FS on which the image IM is displayed may correspond to a front surface of the display device EA and a front surface FS of a window 100. Hereinafter, the display surface and front surface of the display device EA, and the front surface of the window 100 will be referred to with an identical reference numeral. The image IM may include a still image as well as a moving image. In FIG. 1A, a clock window and application icons are illustrated as an example of the image IM.

According to the exemplary embodiment, on the basis of the direction in which the image IM is displayed, a front surface (or an upper surface) and a rear surface (or a lower surface) of each member are defined. The front surface and the rear surface are opposed to each other in the third direction DR3, and normal directions of the front surface and the rear surface may be parallel to the third direction DR3. On the other hand, directions indicated by the first to third directions DR1, DR2, and DR3 are relative concepts to each other, and may be changed to other directions. Hereinafter, the first to third directions are directions respectively indicated by the first to third directions DR1, DR2, and DR3, and are referred to with the same reference numerals.

The display device EA may include a window 100, a display module 200, a driving circuit unit 300, a housing 400, and electronic modules 500. According to the exemplary embodiment, the window 100 and the housing 400 are combined to provide the appearance of the display device EA.

The window 100 may include an optically transparent insulation material. For example, the window 100 may include glass or plastic. The window 100 may have a multilayer structure or a single-layer structure. For example, the window 100 may include a plurality of plastic films bonded by an adhesive or a glass substrate and a plastic film bonded by an adhesive.

The window 100 may be divided into a transmission region TA and a bezel region BZA on a plane. In the present specification, the expression "on a plane" may mean when viewed from the third direction DR3. In addition, "thickness direction" may mean the third direction DR3.

The transmission region TA may be an optically transparent region. The bezel region BZA may have a relatively low optical transmittance in comparison to the transmission region TA. The bezel region BZA may define the shape of the transmission region TA. The bezel region BZA may be adjacent to the transmission region TA, and surround the transmission region TA.

The bezel region BZA may have a prescribed color. The bezel region BZA may cover a peripheral region NAA of the display module 200 to block the peripheral region NAA from being visibly recognized. On the other hand, these are exemplarily illustrated, and the bezel region BZA may be omitted in the window 100 according to an exemplary embodiment.

In an exemplary embodiment, the sensor regions SA1 and SA2 may be regions configured to be superposed with the electronic modules 500 to be described later. The display device EA may receive an external signal required for the electronic modules 500 through the sensor regions SA1 and SA2, or externally provide signals output from the electronic modules 500. In an exemplary embodiment, the sensor regions SA1 and SA2 may be defined to be superposed with the transmission region TA. Accordingly, a separate region for providing the sensor regions SA1 and SA2 in a region other than the transmission region TA may be omitted. Accordingly, the area of the bezel region BZA may be reduced.

FIG. 1B exemplarily illustrates that the sensor regions SA1 and SA2 are two, but the exemplary embodiment is not limited thereto. For example, the sensor regions SA1 and SA2 may be defined as three or more, and one of them may be omitted and defined as one. In addition, in FIG. 1B, the sensor regions SA1 and SA2 are exemplarily defined at a left and upper side of the transmission region TA, but may be defined at various regions such as a right upper side, central portion, left lower side, or right lower side of the transmission region TA. In addition, one sensor region SA1 may be defined at the left upper side of the transmission region TA, and the other sensor region SA2 may be defined at the right upper side of the transmission region TA.

The display module 200 may be disposed under the window 100. In the present specification, "under" may mean an opposite direction to a direction in which the display module 200 provides an image IM. The display module 200 may display the image IM and sense an external input TC. The display module 200 includes a front surface IS including an active region AA and the peripheral region NAA. The active region AA may be an area activated according to the electrical signal.

According to the exemplary embodiment, the active region AA may be a region in which the image IM is displayed, and the external input TC is sensed. The transmission region TA overlaps at least the active region AA. For example, the transmission region TA overlaps the entire surface or at least a part of the active region AA. Accordingly, a user may visibly recognize the image IM or provide the external input TC through the transmission region TA.

The peripheral region NAA may be covered by the bezel region BZA. The peripheral region NAA is adjacent to the active region AA. The peripheral region NAA may surround the active region AA. In the peripheral region NAA, a driving circuit or driving lines for driving the active region AA may be disposed.

According to the exemplary embodiment, the display module 200 is assembled in a flat state in which the active region AA and the peripheral region NAA face the window 100. However, this is only exemplary, and a part of the peripheral region NAA may be curved. At this point, a part of the peripheral region NAA faces the rear surface of the display device EA, which results in reduction in the area of the bezel region BZA from the front surface of the display device EA. Alternatively, the display module 200 may also be assembled in a state where a part of the active region AA is also curved. Alternatively, in the display module 200 according to an exemplary embodiment, the peripheral region NAA may be omitted.

The display module 200 may include a display panel 210 and an input sensing unit 220.

The display panel 210 may be a component configured to substantially generate the image IM. The image IM generated by the display panel 210 is displayed on the front surface IS, and visibly recognized by the user from the outside.

The input sensing unit 220 senses the external input TC applied externally. For example, the input sensing unit 220 may sense the external input TC provided to the window 100. The external input TC may be a user input. The user input includes various types of external inputs such as a part of the user's body, light, heat, a pen, or pressure. According to the exemplary embodiment, the external input TC is illustrated as the hand of the user applied to the front surface FS. However, this is only exemplary, and as described above, the external input TC may be provided in various types. In addition, according to the structure of the display device EA, the external input TC applied to a side surface or rear surface of the display device EA may also be sensed, and the embodiment is not limited thereto.

The driving circuit unit 300 may be electrically connected to the display panel 210 and the input sensing unit 220. The driving circuit unit 300 may include a main circuit board MB, a first flexible film CF1, and a second flexible film CF2.

The first flexible film CF1 is electrically connected to the display panel 210. The first flexible film CF1 may connect the display panel 210 with the main circuit board MB. The first flexible film CF1 may be connected to pads (display pads) of the display panel 210 disposed in the peripheral region NAA. The first flexible film CF1 provides an electrical signal for driving the display panel 210 to the display panel 210. The electrical signal may be generated from the first flexible film CF1 or the main circuit board MB.

The second flexible film CF2 is electrically connected with the input sensing unit 220. The second flexible film CF2 may connect the input sensing unit 220 with the main circuit board MB. The second flexible film CF2 may be connected to pads (sensing pads) of the input sensing unit 220 disposed in the peripheral region NAA. The second flexible film CF2 provides an electrical signal for driving the input sensing unit 220 to the input sensing unit 220. The electrical signal may be generated from the second flexible film CF2 or the main circuit board MB.

The main circuit board MB may include various type of driving circuits for driving the display module 200 or a connector or the like for supplying power. The first flexible film CF1 and the second flexible film CF2 may be connected to the main circuit board MB. According to an exemplary embodiment, the display module 200 may be easily controlled through one main circuit board MB. However, this is only exemplary, and in the display module 200 according to an exemplary embodiment, the display panel 210 and the input sensing unit 220 may be connected to different main circuit boards, or any one of the first flexible film CF1 and the second flexible film CF2 may not be connected to the main circuit board MB. The inventive concepts are not limited to any one embodiment.

In an exemplary embodiment, one region of the display module 200, which corresponds to the sensor regions SA1 and SA2, may have relatively high transmissivity in comparison to the active region AA that does not overlap the sensor regions SA1 and SA2. For example, at least a part of the components of the display panel 210 and components of the input sensing unit 220 may be removed. Accordingly, the electronic modules 500 disposed overlapping the sensor regions SA1 and SA2 may easily deliver and/or receive a signal through the sensor regions SA1 and SA2.

FIG. 1B exemplarily illustrates that prescribed holes MH1 and MH2, hereinafter, module holes) are defined in one region of the display module 200 that corresponds to the sensor regions SA1 and SA2. The module holes MH1 and MH2 may be defined in the active region AA to penetrate through the display module 200. The display panel 210 and the input sensing unit 220 may be penetrated by the module holes MH1 and MH2. In other words, the module holes MH1 and MH2 may be defined by removing all the components of the display panel 210 and the components of the input sensing unit 220 disposed overlapping the sensor regions SA1 and SA2. The module holes MH1 and MH2 are defined in the active regions AA, and thus the sensor regions SA1 and SA2 may be provided in the transmission region TA.

The electronic modules 500 may include a first electronic module 501 and a second electronic module 502. On a plane, the first and second electronic modules 501 and 502 may overlap the module holes MH1 and MH2, and the sensor regions SA1 and SA2. The first and second electronic modules 501 and 502 may be disposed under the display module 200, or at least a part of the first and second electronic modules 501 and 502 may be accommodated in the module holes MH1 and MH2. The first and second electronic modules 501 and 502 may receive an external input delivered through the sensor regions SA1 and SA2 or provide an output through the sensor regions SA1 and SA2.

The housing 400 is coupled to the window 100. The housing 400 is coupled with the window 100 to provide an internal space. The display module 200 and the electronic modules 500 may be accommodated in the internal space.

The housing 400 may include a material having relatively high hardness. For example, the housing 400 may include a plurality of frames and/or plates including glass, plastic, metal, or a combination thereof. The housing 400 may stably protect the components of the display device EA accommodated in the internal space from an external shock.

In relation to FIG. 2, the display device EA may include a display module 200, a power supply module PM, a first electronic module EM1 and a second electronic module EM2. The display module 200, the power supply module PM, the first electronic module EM1 and the second electronic module EM2 may be electrically connected with each other.

The power supply module PM supplies power required for the general operation of the display device EA. The power supply module PM may include a typical battery module.

The first electronic module EM1 and the second electronic module EM2 may include various functional modules for operating the display device EA.

The first electronic module EM1 may be directly mounted in a mother board which is electrically connected to the display module 200, or mounted in a separate board and electrically connected to the mother board through a connector or the like.

The first electronic module EM1 may include a control module CM, a wireless communication module TM, an image input module IIM, an acoustic input module AIM, a memory MM, and an external interface IF. Some of the modules are not mounted in the mother board, and may be electrically connected thereto through a flexible circuit board.

The control module CM may control the general operation of the display device EA. The control module CM may be a microprocessor. For example, the control module CM may activate or deactivate the display module 200. The control module CM may control other modules such as the image input module IIM, the acoustic input module AIM or the like on the basis of a touch signal received from the display module 200.

The wireless communication module TM may transmit/receive a wireless signal to/from another terminal using a Bluetooth or Wi-Fi line. The wireless communication module TM may transmit/receive a voice signal using a typical communication line. The wireless communication module TM may include a transmission unit TM1 that modulates a signal to be transmitted and transmits the modulated signal, and a receiving unit TM2 which demodulates a received signal.

The image input module IIM processes an image signal to convert the processed signal into image data displayable on the display module 200. The acoustic input module AIM receives an external acoustic signal through a microphone in a recording mode, a voice recognition mode, or the like to convert the acoustic signal to electrical voice data.

The external interface IF may plays a role of an interface connected to an external charger, a wired/wireless data port, a card socket (for example, a memory card, a SIM/UIM card), or the like.

The second electronic module EM2 may include an acoustic output module AOM, a light emitting module LM, a light receiving module LRM and a camera module CMM, etc. The above components may be directly mounted in the mother board, or mounted in a separate board to be electrically connected to the display module 200 or the first electronic module EM1 through a connector or the like.

The acoustic output module AOM converts acoustic data received from the wireless communication module TM or acoustic data stored in the memory MM, and outputs the converted one externally.

The light emitting module LM generates output light. The light emitting module LM may output an infrared ray. The light emitting module LM may include an LED element. The light receiving module LRM may sense an infrared ray. The light receiving module LRM may be activated, when the infrared ray of a prescribed level or higher is sensed. The light receiving module LRM may include a CMOS sensor. After the infrared ray generated in the light emitting module LM is output, the infrared ray is reflected by an external object (for example, a user's finger or face) and the reflected infrared ray is incident to the light receiving module LRM. The camera module CMM may capture an external image.

Each of the first and second electronic modules 501 and 502 according to an exemplary embodiment may include at least any one of the first electronic module EM1 and the second electronic module EM2. For example, each of the first and second electronic modules 501 and 502 may include the acoustic output module AOM, the light emitting module LM, the light receiving module LRM, the camera module CMM, and a heat sensing module. The first and second electronic modules 501 and 502 may sense an external object through a signal received from the sensor regions SA1 and SA2, or provide a sound signal such as a voice or light such as infrared ray externally through the sensor regions SA1 and SA2.

In exemplary embodiments, the power supply module PM, the first electronic module EM1, the second electronic module EM2, and/or one or more components thereof, may be implemented via one or more general purpose and/or special purpose components, such as one or more discrete circuits, digital signal processing chips, integrated circuits, application specific integrated circuits, microprocessors, processors, programmable arrays, field programmable gate arrays, instruction set processors, and/or the like.

According to one or more exemplary embodiments, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. In this manner, the power supply module PM, the first electronic module EM1, the second electronic module EM2, and/or one or more components thereof may include or otherwise be associated with one or more memories including code (e.g., instructions) configured to cause the power supply module PM, the first electronic module EM1, the second electronic module EM2, and/or one or more components thereof to perform one or more of the features, functions, processes, etc., described herein.

The memories may be any medium that participates in providing code to the one or more software, hardware, and/or firmware components for execution. Such memories may be implemented in any suitable form, including, but not limited to, non-volatile media, volatile media, and transmission media. Non-volatile media include, for example, optical or magnetic disks. Volatile media include dynamic memory. Transmission media include coaxial cables, copper wire and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CD-RW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

Figure 3A:
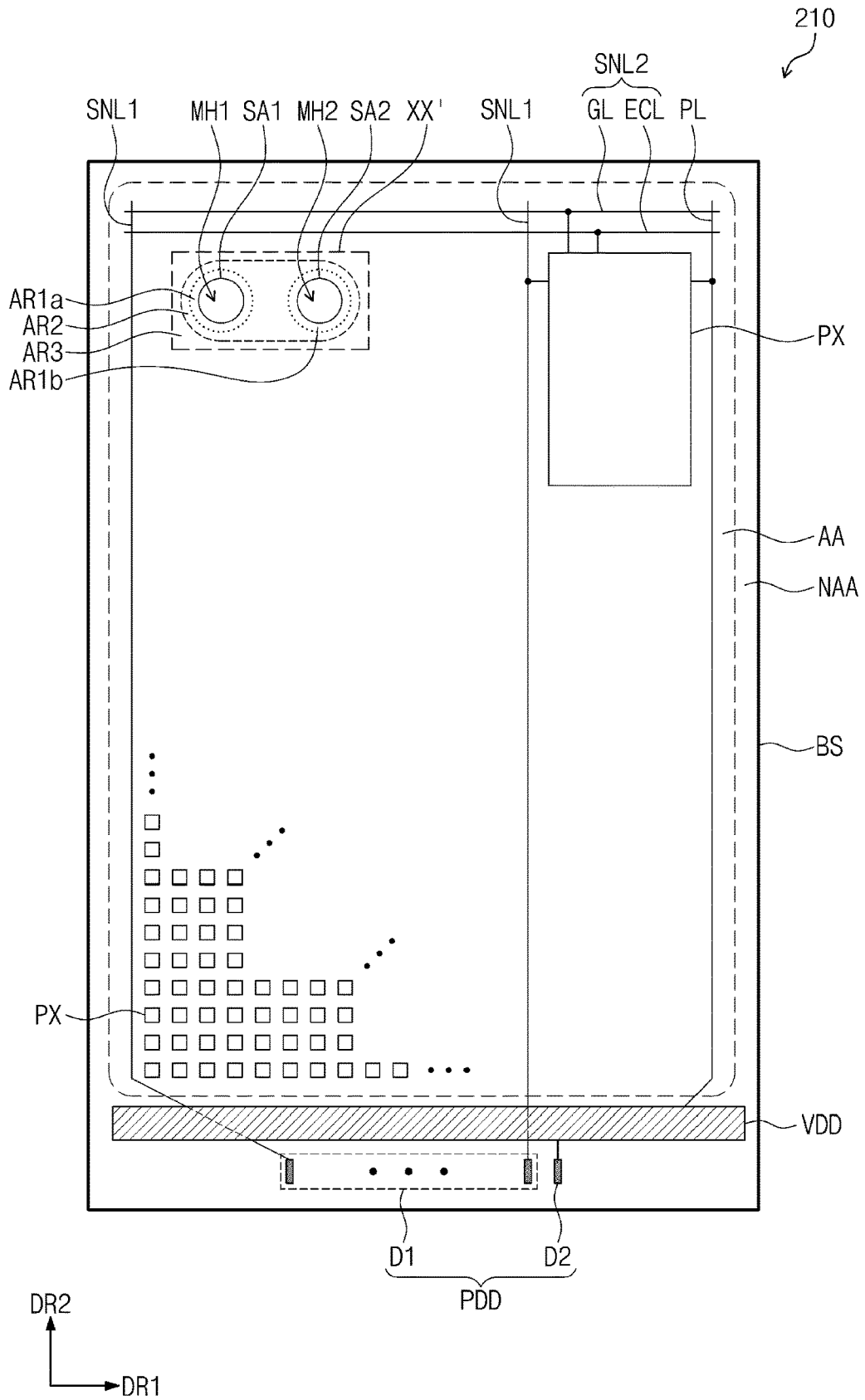
FIG. 3A is a plan view of a display panel according to an exemplary embodiment.
Figure 3B:
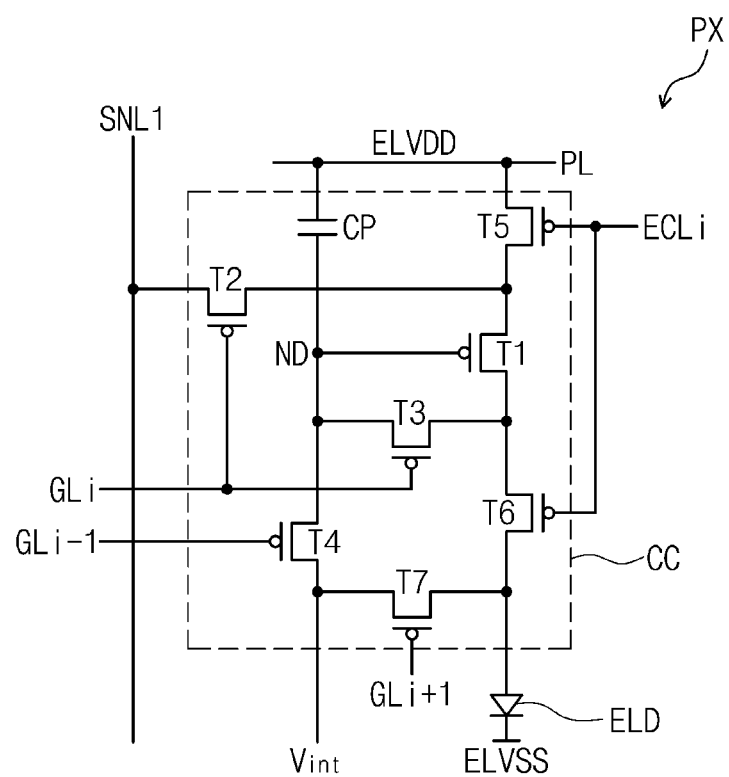
FIG. 3B is an equivalent circuit diagram of a pixel according to an exemplary embodiment.

FIG. 3A is a plan view of a display panel according to an exemplary embodiment. FIG. 3B is an equivalent circuit diagram of a pixel according to an exemplary embodiment.

In relation to FIGS. 3A and 3B, the display panel 210 may include a base layer BS, a plurality of pixels PX, a plurality of signal lines SNL1, SNL2, and PL, and a plurality of display pads PDD.

The active region AA of the display panel 210 may be a region on which an image is displayed, and the peripheral regions NAA may be a region in which a driving circuit, driving lines, or the like are disposed. In FIG. 3A, the active region AA and the peripheral region NAA of the display panel 210 are illustrated. The plurality of pixels PX may be disposed in the active region AA.

The base layer BS may be a laminated structure including a silicon substrate, a plastic substrate, a glass substrate, an insulation film, or a plurality of insulation layers.

The base layer BS may include first regions AR1a and AR1b, a second region AR2, and a third region AR3. The first regions AR1a and AR1b may be defined as separate. In a planar view, the second regions AR2 may surround the first regions AR1a and AR1b, and the third region AR3 may surround the second region AR2. The first regions AR1a and AR1b, the second region AR2, and the third region AR3 may be surrounded by the peripheral region NAA. The pixels PX may be disposed on the third region AR3. In other words, the third region AR3 may correspond to the active region AA.

At least a part of the first regions AR1a and AR1b may be region configured to overlap the sensor regions SA1 and SA2 on a plane. The module holes MH1 and MH2 may be defined in at least the part of the first regions AR1a and AR1b. In other words, components of the display panel 210 may be removed from a region configured to correspond to the sensor regions SA1 and SA2, or disposed not to overlap the sensor regions SA1 and SA2. Each of the module holes MH1 and MH2 may include a hole configured to penetrate the front surface and the rear surface of the base layer BS.

The first regions AR1a and AR1b may surround the module holes MH1 and MH2 on a plane. A structure for blocking a permeation path of external moisture or oxygen such as a groove part or a dam part may be disposed on the first regions AR1a and AR1b, and descriptions thereabout will be provided later.

The pixels PX, which provide an image, may not be disposed on the first regions AR1a and AR1b and the second region AR2 of the base layer BS. Accordingly, a region including the first regions AR1a and AR1b and the second region AR2 of the base layer BS in the display panel 210 may be defined as a non-display region. The pixels PX may be disposed on the third region AR3 of the base layer BS. Accordingly, a region including the third region AR3 of the base layer BS may be defined as a display region. In other words, the display region of the display panel 210 may correspond to the third region AR3 of the base layer BS, and the non-display region of the display panel 210 may correspond to the first regions AR1a and AR1b and the second region AR2 of the base layer BS.

According to an exemplary embodiment, the non-display region, which is surrounded by the display region on a plane, may be disposed. The non-display region may be a region configured to overlap the first and second electronic modules 501 and 502 (see FIG. 1B). Accordingly, a separate region, which is formed to provide sensor regions in the edge of the display region, may be omitted to reduce the area of the bezel region. The bezel region may mean the region configured to surround the display region.

The plurality of signal lines SNL1, SNL2 and PL are connected to the pixels PX to transfer electrical signals to the pixels PX. The first signal line SNL1, the second signal line SNL2, and the power line PL among the signal lines included in the display panel 210 are exemplarily illustrated. The first signal line SNL1 may be referred to as a data line. The first signal line SNL1 may be provided in plurality, and the plurality of first signal lines SNL1 may be arrayed along the first direction DR1. The second signal line SNL2 may include a scan line GL and an emission control line ECL. The scan line GL and the emission control line ECL may be arrayed along the second direction DR2. However, these are only exemplary, and the signal lines SNL1 and SNL2 may further include an initialization voltage line. The exemplary embodiment is not limited thereto.

The plurality of signal lines SNL1, SNL2, and PL may be disposed on the third region AR3. The plurality of signal lines SNL1, SNL2, and PL may not be disposed on the first regions AR1a and AR1b.

In FIG. 3B, an equivalent circuit diagram of one pixel PX among the plurality of pixels PX is exemplarily enlarged and illustrated. In FIG. 3B, a pixel PX connected to an ith scan line GLi and an ith emission control line ECLi is exemplarily illustrated.

The pixel may include a light emitting element ELD and a pixel circuit CC. The pixel circuit CC may include a plurality of transistors T1 to T7 and a capacitor CP. The pixel circuit CC controls a current amount flowing through the light emitting element ELD in correspondence to a data signal.

The light emitting element ELD may emit light in a prescribed luminance in correspondence to the current amount provided from the pixel circuit CC. To this end, the level of the first power source ELVDD may be set higher than that of a second power source ELVSS.

Each of the plurality of transistors T1 to T7 may include an input electrode (or a source electrode), an output electrode (or a drain electrode), and a control electrode (or a gate electrode). For convenience, any one of the input electrode and the output electrode may be referred to as a first electrode, and the other may be referred to as a second electrode in the present specification.

The first electrode of the first transistor T1 is connected to the first power source EL VDD via the fifth transistor T5, and the second electrode of the first transistor T1 is connected to an anode electrode of the light emitting element ELD via the sixth transistor T6. The first transistor T1 may be referred to as a driving transistor in the present specification.

The first transistor T1 controls a current amount flowing through the light emitting element ELD in correspondence to a voltage applied to the control electrode of the first transistor T1.

The second transistor T2 is connected between the first signal line SNL1 and the first electrode of the first transistor T1. In addition, the control electrode of the second transistor T2 is connected to the ith scan line GLi. The second transistor T2 is turned on when the ith scan signal is provided to the ith scan line GLi, and electrically connects the first signal line SNL1 and the first electrode of the first transistor T1.

The third transistor T3 is connected between the second electrode of the first transistor T1 and the control electrode of the first transistor T1. The control electrode of the third transistor T3 is connected to the ith scan line GLi. The third transistor T3 is turned on when the ith scan signal is provided to the ith scan line GLi, and electrically connects the second electrode of the first transistor T1 and the control electrode of the first transistor T1. Accordingly, when the third transistor T3 is turned on, the first transistor T1 is connected in a diode type.

The fourth transistor T4 is connected between a node ND and an initialization power generation unit. In addition, the control electrode of the fourth transistor T4 is connected to the (i−1)th scan line GLi−1. The fourth transistor T4 is turned on when an (i−1)th scan signal is provided to the (i−1)th scan line GLi−1, and provides an initialization voltage Vint to the node ND.

The fifth transistor T5 is connected between the power line PL and the first electrode of the first transistor T1. The control electrode of the fifth transistor T5 is connected to the ith emission line ECLi.

The sixth transistor T6 is connected between the second electrode of the first transistor T1 and the anode electrode of the light emitting element ELD. In addition, the control electrode of the sixth transistor T6 is connected to the ith emission control line ECLi.

The seventh transistor T7 is connected between the initialization power generation unit and the anode electrode of the light emitting element ELD. In addition, the control electrode of the seventh transistor T7 is connected to the (i+1)th scan line GLi+1. In this way, the seventh transistor T7 is turned on, when the (i+1)th scan signal is provided to the (i+1)th scan line GLi+1, and provides the initialization voltage Vint to the anode electrode of the light emitting element ELD.

The seventh transistor T7 may improve black level representation capability of the pixel PX. In detail, when the seventh transistor T7 is turned on, a parasitic capacitor of the light emitting element ELD is discharged. Then, at the time of implementing the black luminance, the light emitting element ELD does not emit light due to a leakage current from the first transistor T1, and accordingly, the black level representation capability may be improved.

Additionally, although FIG. 3B illustrates that the control electrode of the seventh transistor T7 is connected to the (i+1)th scan line GLi+1, but the exemplary embodiment is not limited thereto. In another exemplary embodiment, the control electrode of the seventh transistor T7 may be connected to the ith scan line GLi or a (i−1)th scan line GLi−1.

Even though FIG. 3B is illustrated on the basis of a PMOS, the exemplary embodiment is not limited thereto. In another exemplary embodiment, the pixel circuit CC may be configured from an NMOS. In another exemplary embodiment, the pixel circuit CC may be configured by a combination of an NMOS and a PMOS.

A capacitor CP is disposed between the power line PL and the node ND. The capacitor CP stores a voltage corresponding to a data signal. When the fifth transistor T5 and the sixth transistor T6 are turned on according to the voltage stored in the capacitor CP, a current amount flowing through the first transistor T1 may be determined. The equivalent circuit of the pixel PX in the inventive concepts are not limited to that illustrated in FIG. 3B. In another exemplary embodiment, the pixel PX may be implemented in various types in order to drive the light emitting element ELD.

In relation to FIG. 3A again, the power pattern VDD is disposed in the peripheral region NAA. In the embodiment, the power pattern VDD is connected to a plurality of power lines PL. Accordingly, the display panel 210 includes the power pattern VDD, and thus may provide a substantially identical first power signal to the plurality of pixels PX.

The display pads PDD may include a first pad D1 and a second pad D2. The first pad D1 may be provided in plurality and connected to the first signal lines SNL1. The second pad D2 may be connected to the power pattern VDD and then electrically connected to the power line PL. The display panel 210 may provide, to the pixels PX, electrical signals provided externally through the display pads PDD. On the other hand, the display pads PDD may further include pads for receiving other electrical signals besides the first pad D1 and the second pad D2, and are not limited to any one embodiment.

Figure 4:
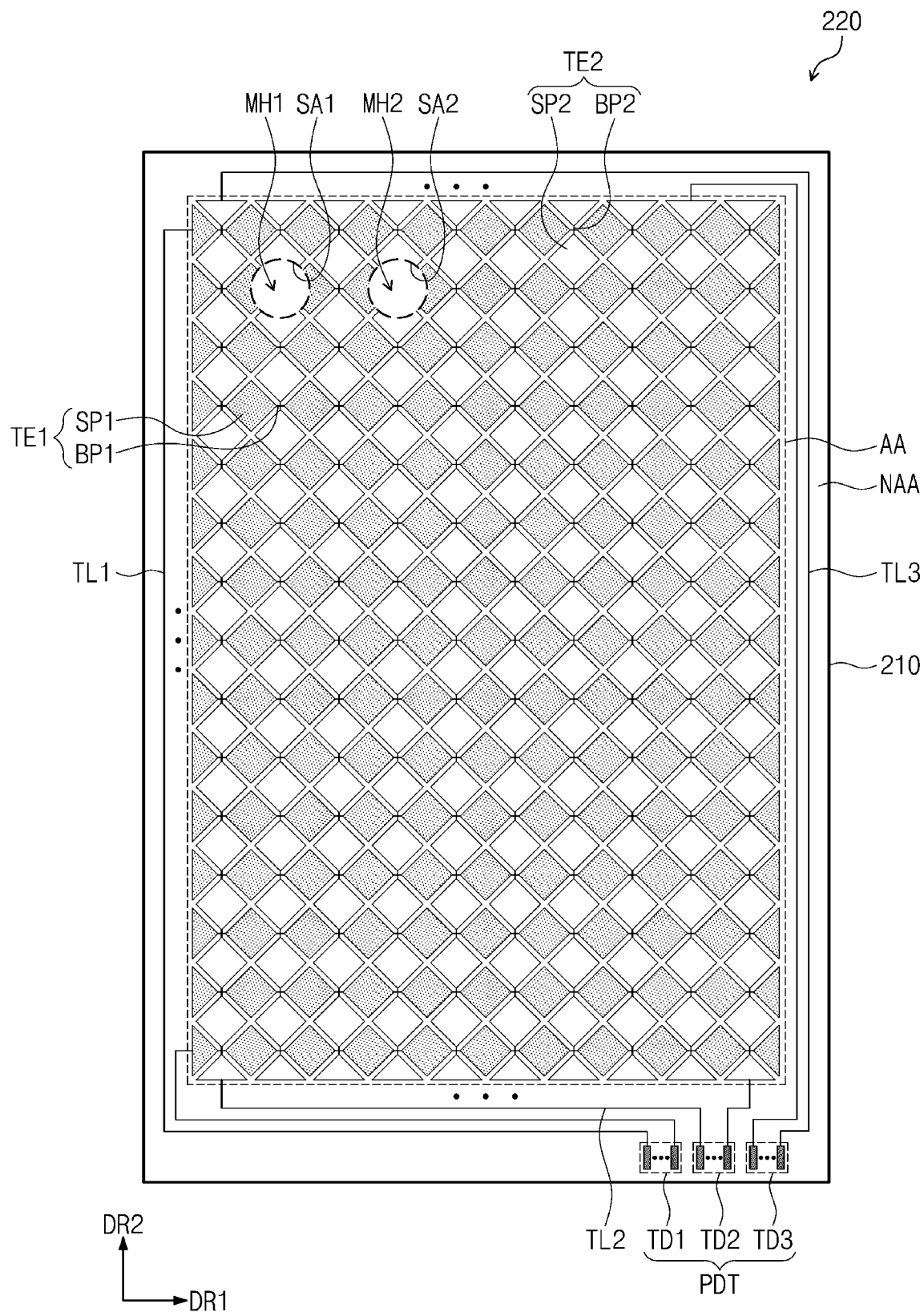
FIG. 4 is a plan view of an input sensing unit according to an exemplary embodiment.

FIG. 4 is a plan view of an input sensing unit according to an exemplary embodiment.

In relation to FIG. 4, the input sensing unit 220 may be disposed on the display panel 210. For example, the input sensing unit 220 may be directly disposed on the display panel 210, and be bonded with the display panel 210 through an adhesive member. After the display panel 210 (see FIG. 1B) is provided, when the input sensing unit 220 is provided in consecutive processes, the input sensing unit 220 may be referred to as an input sensing layer. In addition, when the input sensing unit 220 is bonded with the display panel 210 through the adhesive member, the input sensing unit 220 may be referred to as an input sensing panel.

The input sensing unit 220 includes a first sensing electrode TE1, a second sensing electrode TE2, a plurality of sensing lines TL1, TL2, and TL3, and a plurality of sensing pads PDT.

The first sensing electrode TE1 and the second sensing electrode TE2 are disposed in the active region AA. The input sensing unit 220 may obtain information on the external input TC (see FIG. 1A) through a change in electrostatic capacitance between the first sensing electrode TE1 and the second sensing electrode TE2.

The first sensing electrode TE1 may include first sensing patterns SP1 and first connection patterns BP1. At least one first connection pattern BP1 may be connected to two adjacent first sensing patterns SP1. The second sensing electrode TE2 may include second sensing patterns SP2 and second connection patterns BP2. At least one second connection pattern BP2 may be connected to two adjacent second sensing patterns SP2.

The sensing lines TL1, TL2, and TL3 are disposed in the peripheral region NAA. The sensing lines TL1, TL2, and TL3 may include a first sensing line TL1, a second sensing line TL2, and a third sensing line TL3.

The first sensing line TL1 is connected to the first sensing electrode TE1. The second sensing line TL2 is connected to one terminal of the second sensing electrode TE2. The third sensing line TL3 is connected to the other terminal of the second sensing electrode TE2. The other terminal of the second sensing electrode TE2 may be a part opposing one terminal of the second sensing electrode TE2.

According to an exemplary embodiment, the second sensing electrode TE2 may be connected to the second sensing line TL2, and the third sensing line TL3. Accordingly, sensitivity according to a region may be uniformly maintained with respect to the second sensing electrode TE2 having a relatively longer length than the first sensing electrode TE1. However, this is only exemplary, and the third sensing line TL3 may be omitted. The inventive concepts are not limited to any one embodiment.

The sensing pads PDT are disposed in the peripheral region NAA. The sensing pads PDT may include a first sensing pad TD1, a second sensing pad TD2, and a third sensing pad TD3. The first sensing pad TD1 is connected to the first sensing line TL1 to be electrically connected to the first sensing electrode TE1. The second sensing pad TD2 is connected to the second sensing line TL2, and the third sensing pad TD3 is connected to the third sensing line TL3. Accordingly, the second sensing pad TD2 and the third sensing pad TD3 may be electrically connected to the second sensing electrode TE2.

Some of components of the input sensing unit 220 may be removed in the region corresponding to the sensor regions SA1 and SA2. For example, at least a part between a part of the first sensing electrode TE1 and a part of the second sensing electrode TE2 may not be disposed in the sensor regions SA1 and SA2. According to the exemplary embodiment, the first sensing electrode TE1 disposed overlapping the sensor regions SA1 and SA2 includes a first sensing pattern having the shape with a part thereof removed, and the second sensing electrode TE2 may include a second sensing pattern having the shape with a part thereof removed.

According to an exemplary embodiment, an issue that the electronic modules 500 (see FIG. 1B) are concealed by the first sensing electrode TE1 or the second sensing electrode TE2 may be prevented or suppressed by removing a part of the sensing electrodes TE1 and TE2 in the region that overlaps the sensor regions SA1 and SA2. Accordingly, the sensing sensitivity of the electronic modules 500 may be improved.

Figure 5:
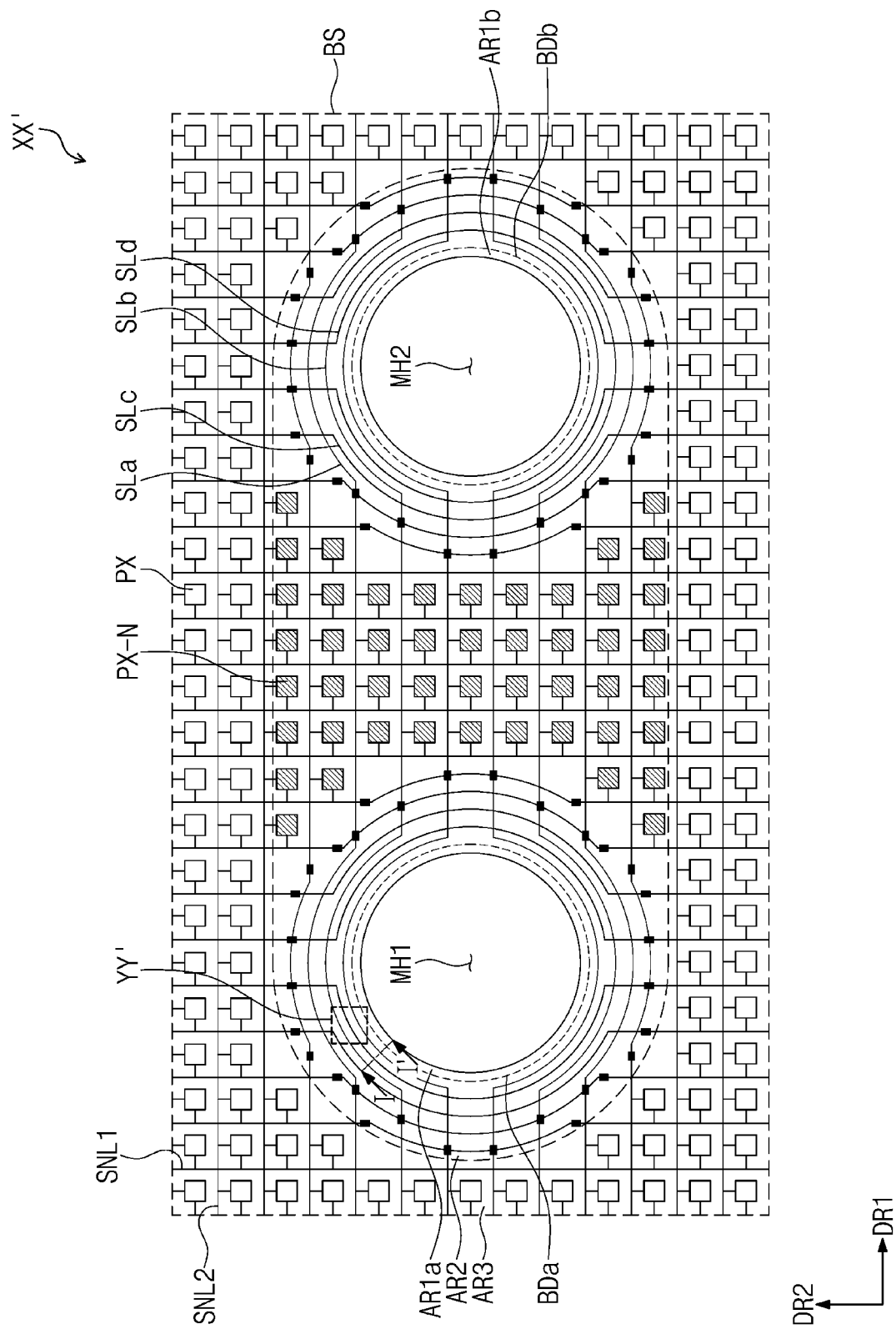
FIG. 5 is an enlarged plan view of an XX' region shown in FIG. 3A.

FIG. 5 is an enlarged plan view of XX' region shown in FIG. 3A.

In relation to FIG. 5, the base layer BS may include the first regions AR1a and AR1b, the second region AR2, and the third region AR3.

The first regions AR1a and AR1b may be separated from each other in the first direction DR1. The module hole MH1 is defined in the first region AR1a, and the module hole MH2 is defined in the first region AR1b. The first region AR1a surrounds the module hole MH1, and the first region AR1b surrounds the module hole MH2.

The second region AR2 may surround the first regions AR1a and AR1b. Non-light emitting pixels PX-N may be disposed on a part of the second region AR2 between the first regions AR1a and AR1b. For distinction from the pixels PX, the non-light emitting pixels PX-N are shown by hatching. The non-light emitting pixels PX-N may be pixels that do not emit light. In other words, the non-light emitting pixels PX-N may be pixels that display black.

The third region AR3 may surround the second region AR2. The third region AR3 may correspond to the active region AA (see FIG. 3A) of the display panel 210 (see FIG. 3A). The pixels PX may be disposed on the third region AR3.

The first signal lines SNL1 and the second signal lines SNL2 may be disposed on the third region AR3. The first line SLa, the second line SLb, the third line SLc and the fourth line SLd may be disposed on the second region AR2. The first to fourth lines SLa, SLb, SLc, and SLd may be disposed on different layers, and descriptions thereabout will be provided later. The second region AR2 may be referred to as a peripheral part of a hole. The hole means one of the holes defined in the base layer BS configured to provide the module holes MH1 and MH2. The first to fourth lines SLa, SLb, SLc, and SLd may be included in a line part. The line part may include a first line part and a second line part. The first line part may include a first line SLa and a second line SLb, and the second line part may include a third line SLc and a fourth line SLd.

One of the first signal lines SNL1 may be electrically connected to the third line SLc, and another one of the first signal lines SNL1 may be electrically connected to the fourth line SLd. The first signal lines SNL1 may be electrically connected to the second line part. One of the second signal lines SNL2 may be electrically connected to the first line SLa, and another one of the second signal lines SNL2 may be electrically connected to the second line SLb. The second signal lines SNL2 may be electrically connected to the first line part.

The boundary BDa between the first region AR1a and the second region AR2, and the boundary BDb between the first region AR1b and the second region AR2 may have a circular shape. The first to fourth lines SLa, SLb, SLc and SLd may have the shapes corresponding to the shapes of the boundaries BDa and BDb, and may be extended.

Figure 6:
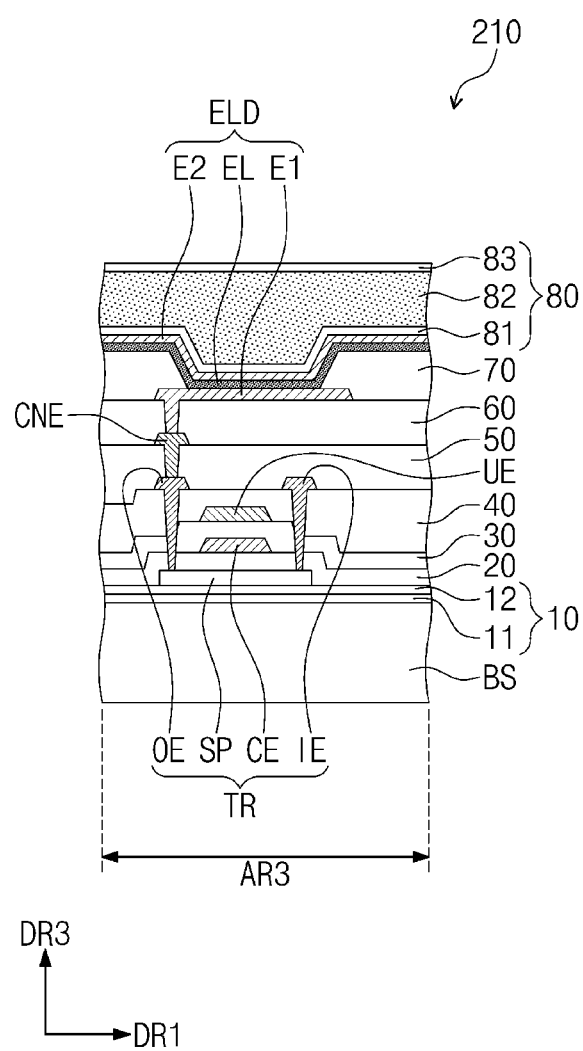
FIG. 6 is a cross-sectional view of a display panel according to an exemplary embodiment.

FIG. 6 is a cross-sectional view of a display panel according to an exemplary embodiment. FIG. 6 is a cross-sectional view of the display panel 210 including the third region AR3 of the base layer BS. FIG. 6 may be a cross-sectional view of a region in which one pixel is disposed.

In relation to FIG. 6, a first insulation layer 10 is disposed on the base layer BS. The first insulation layer 10 may include a barrier layer 11 and a buffer layer 12.

The barrier layer 11 may include an inorganic material. The barrier layer 11 may prevent or suppress oxygen or moisture flowed in through the base layer BS from permeating into the pixel PX (see FIG. 5). The buffer layer 12 may include an inorganic material. The buffer layer 12 may provide surface energy lower than that of the base layer BS to the pixel PX so that the pixel PX is stably provided on the base layer BS. In FIG. 6, each of the barrier layer 11 and the buffer layer 12 is illustrated as a single layer. However, this is only exemplary, and the barrier layer 11 and the buffer layer 12 according to an exemplary embodiment are provided in plurality and may be alternately laminated. Alternatively, at least any one of the barrier layer 11 and the buffer layer 12 may be provided in plurality or omitted.

Each of the pixels PX may include a pixel circuit CC (see FIG. 3B) and a light emitting element ELD. The pixel circuit CC may include transistors T1 to T7 (see FIG. 3B) and a capacitor CP (see FIG. 3B), etc. In FIG. 6, only one transistor TR is illustrated. The transistor TR may be the first transistor T1 described in relation to FIG. 3B.

The transistor TR may be disposed on the first insulation layer 10. The transistor TR includes a semiconductor pattern SP, a control electrode CE, an input electrode IE, and an output electrode OE. The semiconductor pattern SP is disposed on the first insulation layer 10. The semiconductor pattern SP may include a semiconductor material. The control electrode CE is separated from the semiconductor pattern SP with a second insulation layer 20 interposed therebetween. The control electrode CE may be connected to one electrode of the capacitor CP.

The input electrode IE and the output electrode OE may be separated from the control electrode CE with a third insulation layer 30 and a fourth insulation layer 40 interposed therebetween. The input electrode IE and the output electrode OE penetrate through the second insulation layer 20, the third insulation layer 30 and the fourth insulation layer 40 to be respectively connected to one side and the other side of the semiconductor pattern SP.

An upper electrode UE may be disposed between the third insulation layer 30 and the fourth insulation layer 40. The upper electrode UE may be connected to another electrode of the capacitor CP.

A fifth insulation layer 50 may be disposed on the fourth insulation layer 40 to cover the input electrode IE and the output electrode OE. The fourth insulation layer 40 may include an organic material and/or an inorganic material, and have a single layer or multilayer structure.

A connection electrode CNE may be disposed on the fifth insulation layer 50. The connection electrode CNE may be connected to the output electrode OE. A sixth insulation layer 60 may be disposed on the connection electrode CNE.

The transistor TR according to an exemplary embodiment may be provided in various structures, and is not limited to the embodiment illustrated in FIG. 6.

The light emitting element ELD is disposed on the sixth insulation layer 60. The light emitting element ELD may include a first electrode E1, an emission layer EL, and a second electrode E2. The first electrode E1 may penetrate through the sixth insulation layer 60 to be electrically connected to the transistor TR through the connection electrode CNE.

The seventh insulation layer 70 may be disposed on the sixth insulation layer 60. An opening part is defined in the seventh insulation layer 70, and the opening part may expose at least a part of the first electrode E1. The seventh insulation layer 70 may be a pixel definition layer.

The emission layer EL may be disposed on the first electrode E1 exposed by the opening part defined in the seventh insulation layer 70. The emission layer EL may include a light emitting material. For example, the emission layer EL may be provided with at least any one of materials emitting red, green, or blue light. The emission layer EL may include a fluorescent material or phosphorescent material. The emission layer EL may include an organic light emitting material and an inorganic light emitting material. The emission layer EL may emit light in response to a potential difference between the first electrode E1 and the second electrode E2.

The second electrode E2 may be disposed on the emission layer EL. The second electrode E2 may have a one-body shape extended from the active region AA (see FIG. 3A) to the peripheral region NAA (see FIG. 3A). The second electrode E2 may be commonly provided to the plurality of pixels PX (see FIG. 3A). The light emitting elements ELD disposed at the respective pixels PX receive a common second power supply voltage through the second electrode E2.

The second electrode E2 may include a transmissive conductive material or a semi-transmissive conductive material. Accordingly, light generated by the emission layer EL may be easily emitted towards the third direction DR3 through the second electrode E2. However, this is only exemplary, and the light emitting element ELD according to the design of an exemplary embodiment may be driven in a bottom emission scheme in which the first electrode E1 includes a transmissive or semi-transmissive material, or driven in a dual emission scheme in which the light is emitted towards both the front and rear surfaces. The inventive concepts are not limited to any one embodiment.

An eighth insulation layer 80 is disposed on the light emitting element ELD to encapsulate the light emitting element ELD. According to the exemplary embodiment, the eighth insulation layer 80 may be an encapsulation layer. The encapsulation layer 80 may have a one-body shape extended from the active region AA (see FIG. 3A) to the peripheral region NAA (see FIG. 3A). On the other hand, although not shown, a capping layer configured to cover the second electrode E2 may be further disposed between the second electrode E2 and the eighth insulation layer 80.

The eighth insulation layer 80 may include a first inorganic layer 81, an organic layer 82, and a second inorganic layer 83 sequentially laminated along the third direction DR3. According to the exemplary embodiment, each of the first inorganic layer 81, the organic layer 82, and the second inorganic layer 83 is shown as a single layer. However, this is only exemplary. At least one of the first inorganic layer 81, the organic layer 82, and the second inorganic layer 83 may be provided in plurality, or omitted. The inventive concepts are not limited to any one embodiment.

The first inorganic layer 81 may cover the second electrode E2. The first inorganic layer 81 may prevent or suppress external moisture or oxygen from permeating into the light emitting element ELD. For example, the first inorganic layer 81 may include silicon nitride, silicon oxide, or a compound thereof. The first inorganic layer 81 may be provided through a deposition process.

The organic layer 82 may be disposed on the first inorganic layer 81 to contact the first inorganic layer 81. The organic layer 82 may provide a flat surface on the first inorganic layer 81. In detail, the organic layer 82 may provide a flat surface in the active region AA.

A curve of the upper surface of the first inorganic layer 81 or a particle or the like present on the first inorganic layer 81 may be covered by the organic layer 82 to block the surface state of the upper surface of the first inorganic layer 81 from affecting the components provided on the organic layer 82. In addition, the organic layer 82 may relieve the stress between layers contacting each other. The organic layer 82 may include an organic material, and be provided through a solution process such as a spin coating, slit coating, or inkjet process.

The second inorganic layer 83 is disposed on the organic layer 82 to cover the organic layer 82. The second inorganic layer 83 may be stably provided on a relatively flat surface than being disposed on the first inorganic layer 81. The second inorganic layer 83 encapsulates moisture or the like discharged from the organic layer 82 to prevent or suppress the moisture or the like from flowing externally. The second inorganic layer 83 may include silicon nitride, silicon oxide, or a compound thereof. The second inorganic layer 83 may be provided through a deposition process.

Figure 7A:
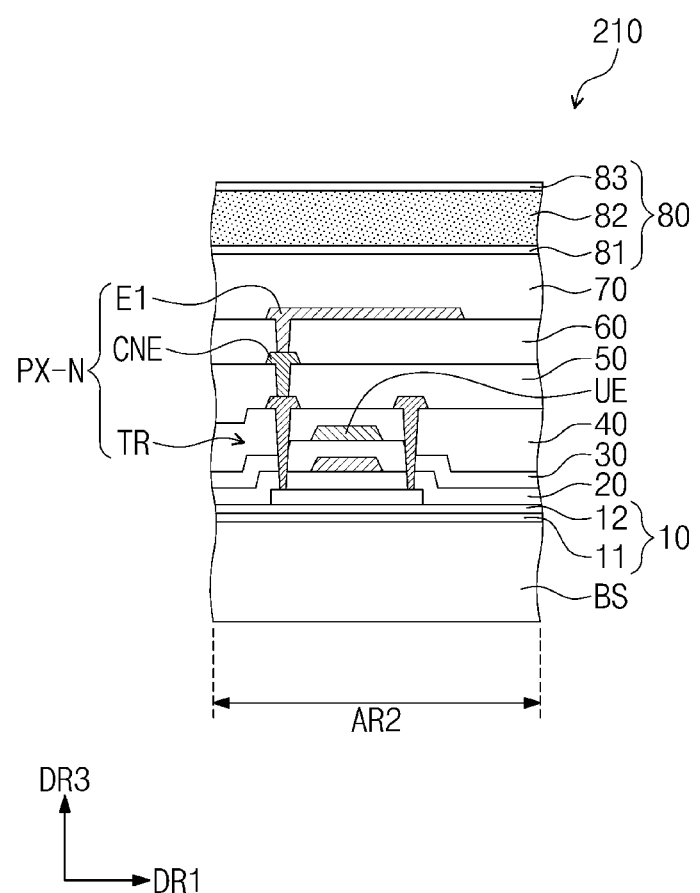
FIG. 7A is a cross-sectional view of a display panel according to an exemplary embodiment.

FIG. 7A is a cross-sectional view of a display panel according to an exemplary embodiment. FIG. 7A is a cross-sectional view of the display panel 210 including the second region AR2 of the base layer BS. FIG. 7A may be a cross-sectional view of a region in which the non-light emitting pixel PX-N (see FIG. 5) is disposed. In describing FIG. 7A, like reference numerals are given to the same elements as those described in relation to FIG. 6, and descriptions thereabout will be omitted.

In relation to FIG. 7A, in comparison with the typical pixel PX (see FIG. 3A), the non-light emitting pixel PX-N may not include some elements. For example, the non-light emitting pixel PX-N may not include the emission layer EL (see FIG. 6) and the second electrode E2 (see FIG. 6). The non-light emitting pixel PX-N may include the transistor TR, the connection electrode CNE and the first electrode E1. The non-light emitting pixel PX-N may not include some of necessary elements for generating light. Accordingly, the non-light emitting pixel PX-N may not emit light. The non-light emitting pixel PX-N may be understood as a pixel configured to display black.

Figure 7B:
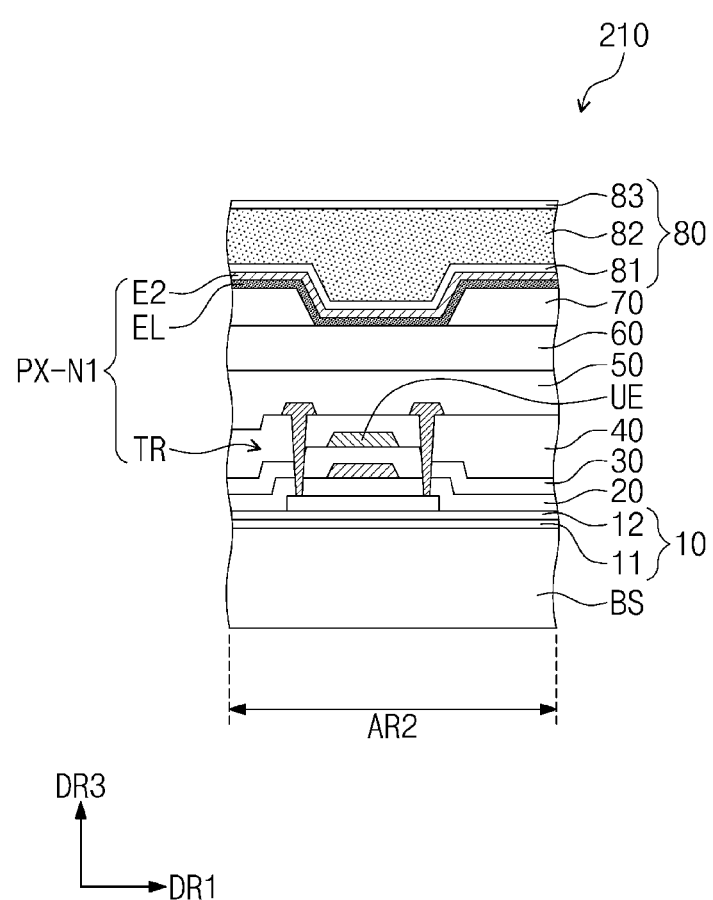
FIG. 7B is a cross-sectional view of a display panel according to an exemplary embodiment.

FIG. 7B is a cross-sectional view of a display panel according to an exemplary embodiment. FIG. 7B is a cross-sectional view of the display panel 210 including the second region AR2 of the base layer BS. FIG. 7B may be a cross-sectional view of a region corresponding to a region in which the non-light emitting pixel PX-N (see FIG. 5) is disposed. In describing FIG. 7B, like reference numerals are given to the same elements as those described in relation to FIG. 6, and descriptions thereabout will be omitted.

In relation to FIG. 7B, in comparison with the typical pixel PX (see FIG. 3A), the non-light emitting pixel PX-N1 may not include some elements. For example, the non-light emitting pixel PX-N1 may include the transistor TR, the emission layer EL and the second electrode E2, and may not include the connection electrode CNE (see FIG. 6) and the first electrode E1 (see FIG. 6). Accordingly, the non-light emitting pixel PX-N1 may not emit light.

In FIGS. 7A and 7B, the non-light emitting pixels PX-N and PX-N1 are exemplified, but the configurations of the non-light emitting pixels PX-N and PX-N1 are not limited thereto. For example, the non-light emitting pixel may include all the components configured to provide the pixel, or may not include at least some of the components configured to provide the pixel. For example, when the non-light emitting pixel includes all the components configured to provide the pixel, the non-light emitting pixel may be controlled not to emit light.

Figure 8A:
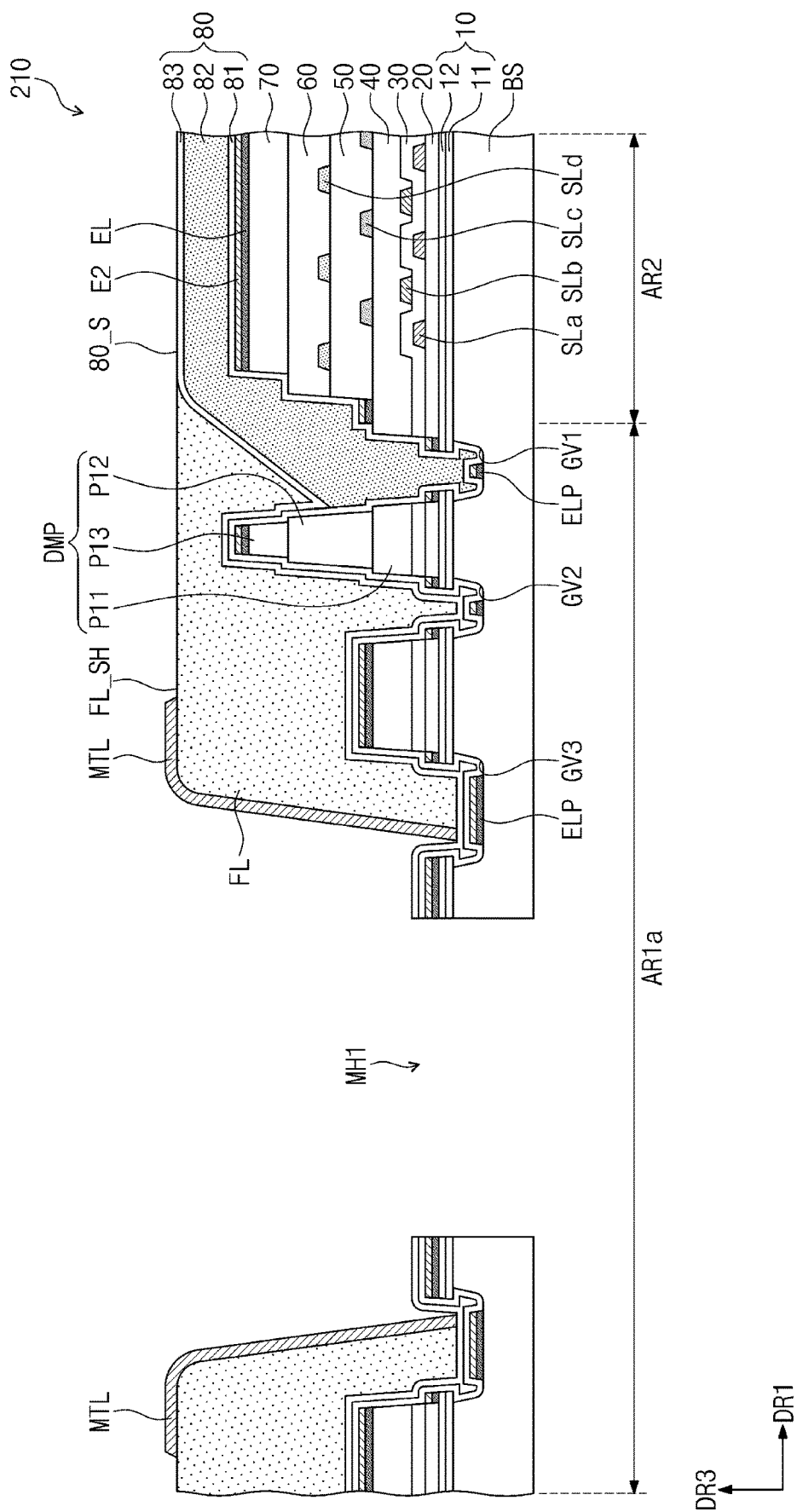
FIG. 8A is a cross-sectional view of a display panel according to an exemplary embodiment.

FIG. 8A is a cross-sectional view of a display panel according to an exemplary embodiment. FIG. 8A is a cross-sectional view of the display panel 210 including the first region AR1a and the second region AR2 of the base layer BS. FIG. 8A illustrates a peripheral part of the module hole MH1. The peripheral part of the module hole MH2 (see FIG. 5) may also have substantially the same structure as the module hole MH1.

In relation to FIGS. 6 and 8A, groove parts GV1, GV2, and GV3 may be defined in the first area AR1a of the base layer BS around the module hole MH1. In addition, a dam part DMP may be disposed on the first region AR1a.

Each of the groove parts GV1, GV2, and GV3 may be defined by being retracted from the top surface of the base layer BS. Each of the groove parts GV1, GV2, and GV3 may be provided in such a way that at least a part of the base layer BS is removed. A deposition pattern ELP may be disposed in each of the groove parts GV1, GV2, and GV3, and the deposition pattern ELP may be covered by at least any one of the first inorganic layer 81 and the second inorganic layer 83.

The display panel 210 according to an exemplary embodiment may further include the groove parts GV1, GV2, and GV3 to block continuity between the deposition pattern ELP and the light emitting element ELD. Accordingly, a permeation path of external moisture or oxygen is blocked to prevent or suppress elements disposed in the active region AA (see FIG. 3A) from being damaged.

In addition, the deposition patter ELP disposed in each of the groove parts GV1, GV2, and GV3 may be covered by the first inorganic layer 81 or the second inorganic layer 83 to prevent or suppress the deposition pattern ELP from being moved to and affect another element in the manufacturing process of the display panel 210. Accordingly, the process reliability of the display panel 210 may be improved. On the other hand, this is exemplarily illustrated, and in the display panel 210 according to an exemplary embodiment, the groove parts GV1, GV2, and GV3 may be provided as one body or omitted, and are not limited to any one embodiment.

The groove parts GV1, GV2, and GV3 may be defined as separated from each other. The groove parts GV1, GV2, and GV3 are exemplarily illustrated as separated from the second region AR2 and sequentially provided in a direction close to the module hole MH1. Each of the groove parts GV1, GV2, and GV3 may have a closed line shape configured to surround the module hole MH1 or a discontinuous line shape configured to surround at least a part of the edge of the module hole MH1, and is not limited to any one embodiment.

The dam part DMP is disposed on the first region AR1a to separate a formation region of the organic layer 82 within a prescribed region, and prevents or suppresses additional extension of the organic layer 82. The dam part DMP is provided in plurality to be disposed between the groove parts GV1, GV2, and GV3. The dam part DMP is illustrated to have a laminated structure including first to third layers P11, P12, and P13. However, this is only exemplary. The dam part DMP may have a single layer structure, and is not limited to any one embodiment.

The cover layer FL may be disposed on the first region AR1a. For example, the cover layer FL may cover a non-flat surface provided by the dam part DMP or the groove parts GV1, GV2, and GV3 to provide the flat surface FL_SH. The flat surface FL_SH defined by the cover layer FL may define substantially the same plane as the flat surface 80_S defined by the eighth insulation layer 80.

The display panel 210 may further include a metal pattern MTL. The metal pattern MTL may be disposed on the first region AR1a. The metal pattern MTL may be disposed along the edge of the module hole MH1 to cover at least a part of the cover layer FL. The metal pattern MTL may prevent or protect the cover layer FL from being damaged by a laser beam or the like at the time of providing the module hole MH1. In addition, the metal pattern MTL may press the cover layer FL to prevent or protect the cover layer FL from being lifted.

Signal lines SLa, SLb, SLc, and SLd may be disposed on the second region AR2 of the base layer BS. The signal lines SLa, SLb, SLc, and SLd may include the first line SLa, the second line SLb, the third line SLc and the fourth line SLd.

Some of the first to fourth lines SLa, SLb, SLc, and SLd may be electrically connected to the first signal line SNL1 (see FIG. 5), and the other may be electrically connected to the second signal line SNL2 (see FIG. 5).

The first line SLa may be disposed between the second insulation layer 20 and the third insulation layer 30. The first line SLa may be disposed on the same layer as the control electrode CE. The second line SLb may be disposed between the third insulation layer 30 and the fourth insulation layer 40. The second line SLb may be disposed on the same layer as the upper electrode UE. The third line SLc may be disposed between the fourth insulation layer 40 and the fifth insulation layer 50. The third line SLc may be disposed on the same layer as the output electrode OE and the input electrode IE. The fourth line SLd may be disposed between the fifth insulation layer 50 and the sixth insulation layer 60. The fourth line SLd may be disposed on the same layer as the connection electrode CNE.

Figure 8B:
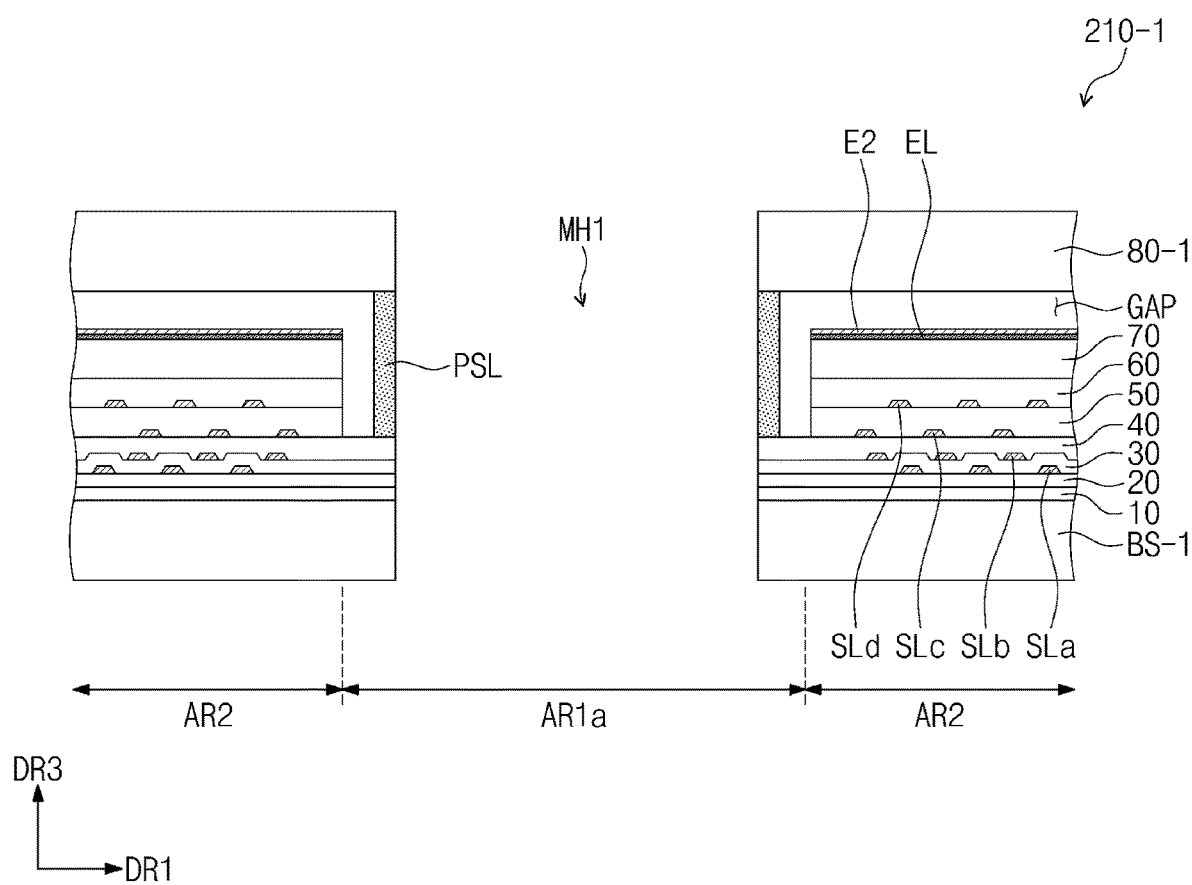
FIG. 8B is a cross-sectional view of a display panel according to an exemplary embodiment.

FIG. 8B is a cross-sectional view of a display panel according to an exemplary embodiment. FIG. 8B is a cross-sectional view of a display panel 210-1 including the first region AR1a and the second region AR2 of the base layer BS. In describing FIG. 8B, a part having a difference with FIG. 8A will be described, like reference numerals are given to the same components as those described in relation to FIG. 8A, and repeated descriptions thereabout will be omitted.

In relation to FIG. 8B, the display panel 210-1 may include a base layer BS-1 and an encapsulation substrate 80-1.

The encapsulation substrate 80-1 may be disposed on the second electrode E2. The encapsulation substrate 80-1 and the second electrode E2 may be separated from each other. A gap GAP between the encapsulation substrate 80-1 and the second electrode E2 may be filled with the air or an inactive gas. In addition, in an exemplary embodiment, the gap GAP may be filled with a filler such as a silicone polymer, an epoxy resin, or an acrylic resin.

The encapsulation substrate 80-1 may be coupled with the base layer BS-1 through a sealing member PSL. The encapsulation substrate 80-1 may be disposed on the base layer BS-1 with a prescribed interval maintained through a sealing member PSL.

The sealing member PSL may be a component configured to define the internal surface of the module hole MH1. The sealing member PSL may include an organic material like a photocurable resin or photoplastic resin, or an inorganic material like a frit seal, and is not limited to any one embodiment.

Figure 9A:
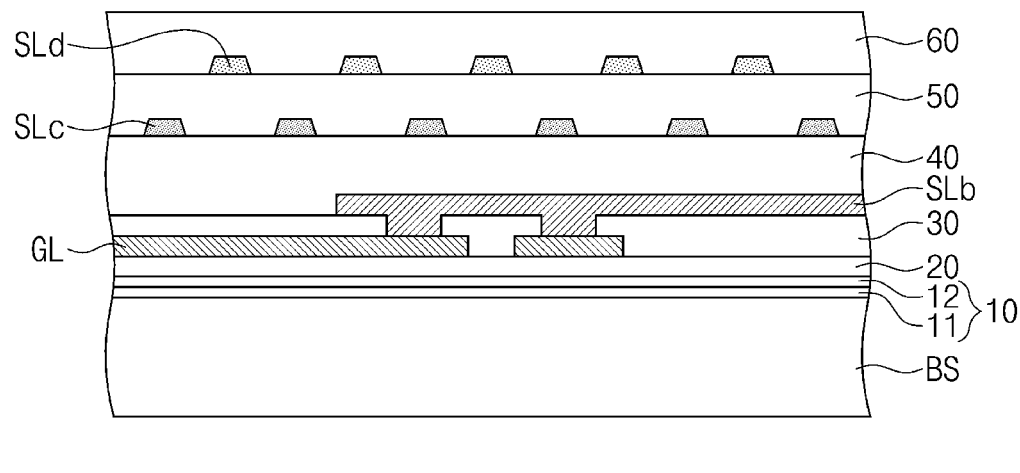
FIG. 9A is a cross-sectional view of a display panel according to an exemplary embodiment.
Figure 9A:
Figure 9B:
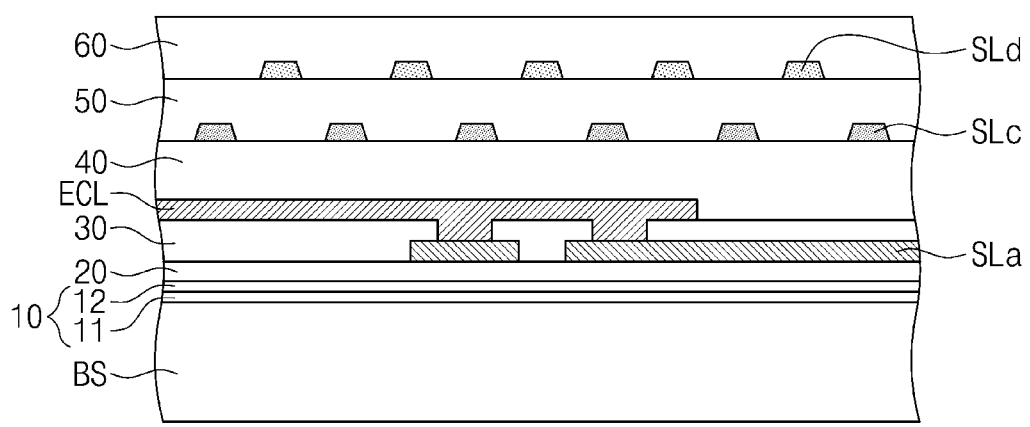
FIG. 9B is a cross-sectional view of a display panel according to an exemplary embodiment.
Figure 9B:

FIG. 9A is a cross-sectional view of a display panel according to an exemplary embodiment. FIG. 9B is a cross-sectional view of a display panel according to an exemplary embodiment. FIGS. 9A and 9B illustrate only some components of the display panel, and some of the components, which do not require descriptions, are not illustrated.

In relation to FIG. 9A, the second line SLb may be electrically connected to the scan line GL. The scan line GL may be one among the second signal lines SNL2 (see FIG. 3A). The scan line GL may be disposed on the same layer as the first line SLa.

In relation to FIG. 9B, the first line SLa may be electrically connected to the emission control line ECL. The emission control line ECL may be one among the second signal lines SNL2 (see FIG. 3A). The emission control line ECL may be disposed on the same layer as the second line SLb.

In an exemplary embodiment, the emission control line ECL may be omitted. In this case, the first line SLa may be electrically connected to one scan line GL, and the second line SLb may be electrically connected to another scan line GL. Lines disposed on the same layer in the third region AR3 (see FIG. 5) may be disposed on different layers in the second region AR2 (see FIG. 5). Accordingly, on a plane, the area of the second region AR2 may be reduced.

Figure 10A:
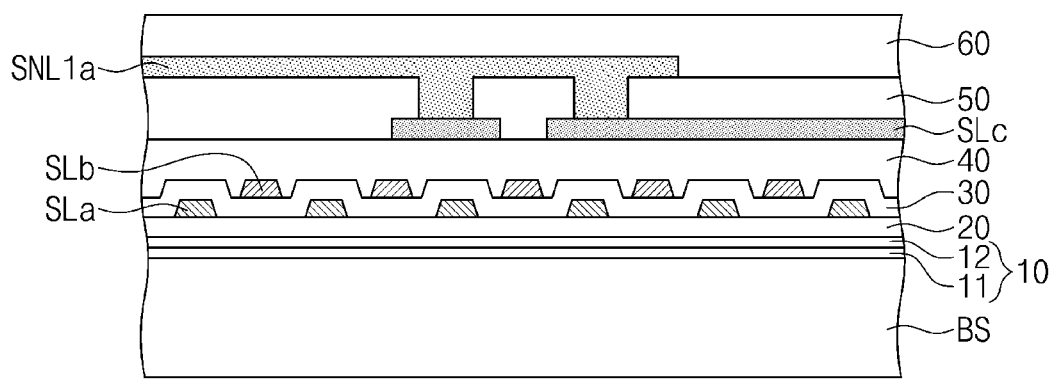
FIG. 10A is a cross-sectional view of a display panel according to an exemplary embodiment.
Figure 10B:
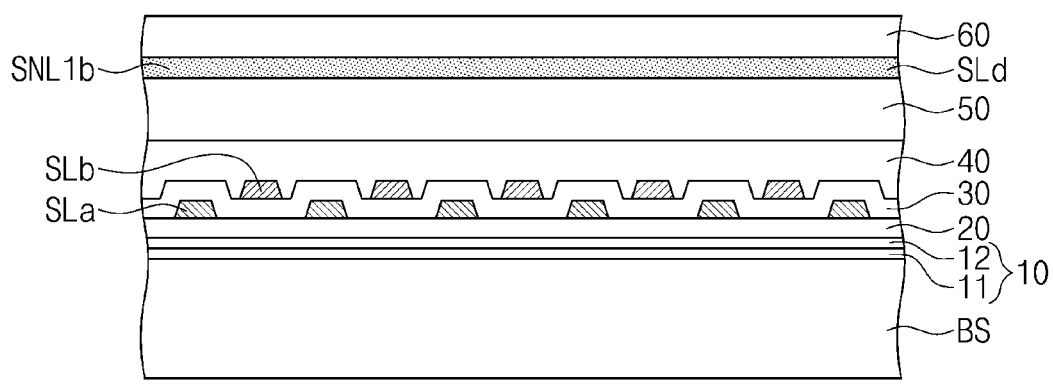
FIG. 10B is a cross-sectional view of a display panel according to an exemplary embodiment.

FIG. 10A is a cross-sectional view of a display panel according to an exemplary embodiment. FIG. 10B is a cross-sectional view of a display panel according to an exemplary embodiment. FIGS. 10A and 10B illustrate only some components of the display panel, and some of the components, which do not require descriptions, are not illustrated.

In relation to FIGS. 10A and 10B, first signal lines SNL1a and SNL1b are illustrated. The first signal lines SNL1a and SNL1b may be data lines.

The first signal lines SNL1a and SNL1b may be disposed between the fifth insulation layer 50 and the sixth insulation layer 60. The first signal lines SNL1a and SNL1b may be disposed on the same layer as the fourth line SLd.

The first signal line SNL1a may penetrate through the fifth insulation layer 50 to be electrically connected to the third line SLc. The first signal line SNL1b may be electrically connected to the fourth line SLd. The fourth line SLd and the first signal line SNL1b may have a one body shape. In other words, the fourth line SLd of the second region AR2 may be extended from the first signal line SNL1b.

For example, the first signal lines respectively connected to pixels configured to emit red and blue light may be electrically connected to the third line SLc like the first signal line SNL1a. A first signal line connected to a pixel configured to emit blue light may be electrically connected to the fourth line SLd like the first signal line SNL1b. However, this is only exemplary, and the exemplary embodiment is not limited thereto.

Figure 11A:
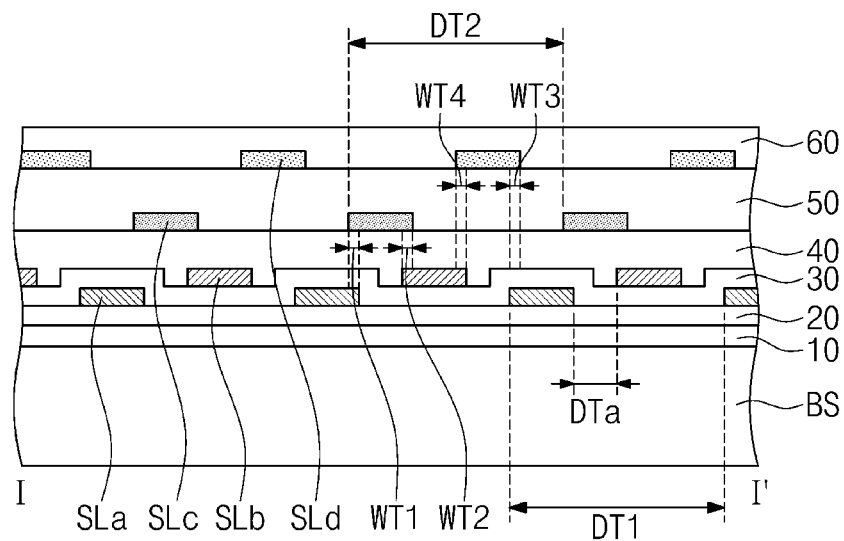
FIG. 11A is a cross-sectional view of the display panel taken along a sectional line I-I' illustrated in FIG. 5.
Figure 11B:
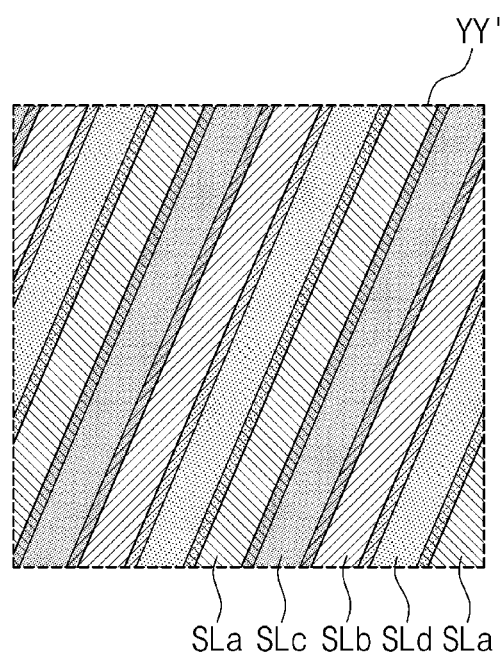
FIG. 11B is an enlarged plan view of an YY' region illustrated in FIG. 5.

FIG. 11A is a cross-sectional view of the display panel taken along a sectional line I-I' illustrated in FIG. 5. FIG. 11B is an enlarged plan view of YY' region illustrated in FIG. 5.

In relation to FIG. 11A, the first line SLa, the second line SLb, the third line SLc and the fourth line SLd are illustrated. The third insulation layer 30 disposed between the first line SLa and the second line SLb may be referred to as a first insulation layer. The fourth insulation layer 40 disposed between the second line SLb and the third line SLc may be referred to as a second insulation layer. The fifth insulation layer 50 disposed between the third line SLc and the fourth line SLd may be referred to as a third insulation layer.

The first line SLa, the third insulation layer 30 (or the first insulation layer), the second line SLb, the fourth insulation layer 40 (or the second insulation layer), the third line SLc, the fifth insulation layer 50 (or the third insulation layer), and the fourth line SLd may be sequentially laminated on the base layer BS.

In a planar view, the first line SLa and the second line SLb may not overlap. In a planar view, the third line SLc and the fourth line SLd may not overlap. In a planar view, a part of the third line SLc may overlap a part of the first line SLa, and another part of the third line SLc may overlap a part of the second line SLb. In a planar view, a part of the fourth line SLd may overlap another part of the first line SLa, and another part of the fourth line SLd may overlap another part of the second line SLb. In a planar view, the first line SLa, the third line SLc, the second line SLb, and the fourth line SLd may be periodically and alternately repeated and arrayed in the above sequence. In a planar view, the first line parts are disposed in a region between the second line parts.

According to an exemplary embodiment, parasitic capacitances between the third line SLc and the fourth line SLd connected to the first signal lines SNL1 and between the first line SLa and the second line SLb connected to the second signal lines SNL2 may be reduced, while the area of the second region AR2 is reduced on a plane. A parasitic capacitance generated between different lines may cause degradation in display quality such as deterioration of image quality. According to an exemplary embodiment, lines disposed on the most adjacent layers may not overlap. Accordingly, the degradation in display quality by the parasitic capacitance may be prevented or suppressed. In addition, the display quality of the display device EA (see FIG. 1A) may be improved.

In addition, an interval between lines disposed on an identical layer in the second region AR2 (see FIG. 5) may be increased. For example, a first interval DT1 between two adjacent first lines SLa and a second interval DT2 between two adjacent third lines SLc may be about 3.5 µm or longer. For example, the first interval DT1 may be about 3.5 µm or longer, and the second interval DT2 may be about 4 µm or longer. According to an exemplary embodiment, even though a stringer defect that a metal film remains occurs in a process for providing lines, a probability that adjacent lines disposed on an identical layer would be shorted may be reduced.

In an exemplary embodiment, the widths of the first line SLa and the second line SLb, and the widths of the third line SLc and the fourth line SLd may be different from each other. For example, each of the widths of the first line SLa and the second line SLb may be about 2 µm, and each of the widths of the third line SLc and the fourth line SLd may be about 2.5 µm. Each of the width WT1 of a region in which the first line SLa and the third line SLc overlap, the width WT2 of a region in which the second line SLb and the third line SLc overlap, the width WT3 of a region in which the first line SLa and the fourth line SLd overlap, and the width WT4 of a region in which the second line SLb and the fourth line SLd overlap may be about 0.75 µm. However, the numerals are only exemplary, and the exemplary embodiment is not limited thereto.

Figure 12A:
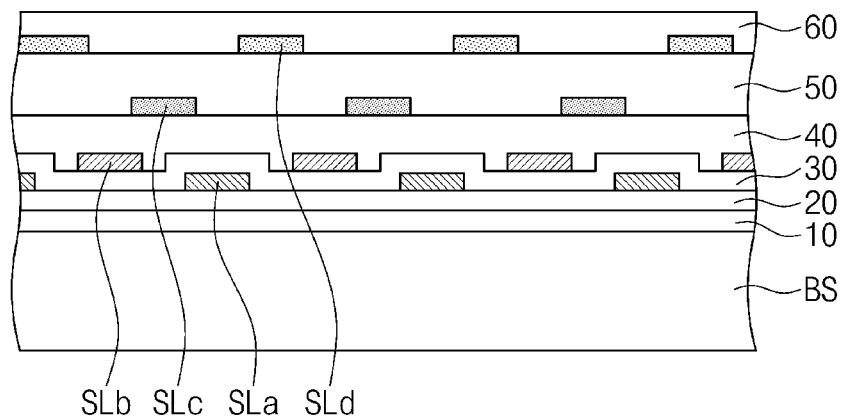
FIG. 12A is a cross-sectional view taken along the sectional line I-I' illustrated in FIG. 5.
Figure 12B:
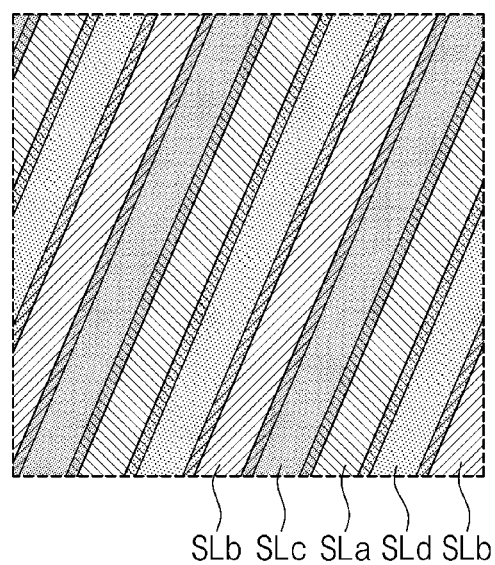
FIG. 12B is an enlarged plan view of the YY' region illustrated in FIG. 5.

FIG. 12A is a cross-sectional view cut along a region corresponding to sectional line I-I' illustrated in FIG. 5. FIG. 12B is an enlarged plan view of a region corresponding to YY' region illustrated in FIG. 5. In description about FIGS. 12A and 12B, only parts that are different from those in FIGS. 11A and 11B will be described, and descriptions about the remaining parts will be omitted.

In comparison with FIGS. 11A and 11B, the arrangement order of the first line SLa and the second line SLb in FIGS. 12A and 12B may be changed. Accordingly, in a planar view, the second line SLb, the third line SLc, the first line SLa, and the fourth line SLd may be periodically and alternately repeated and arrayed in the above sequence.

Figure 13A:
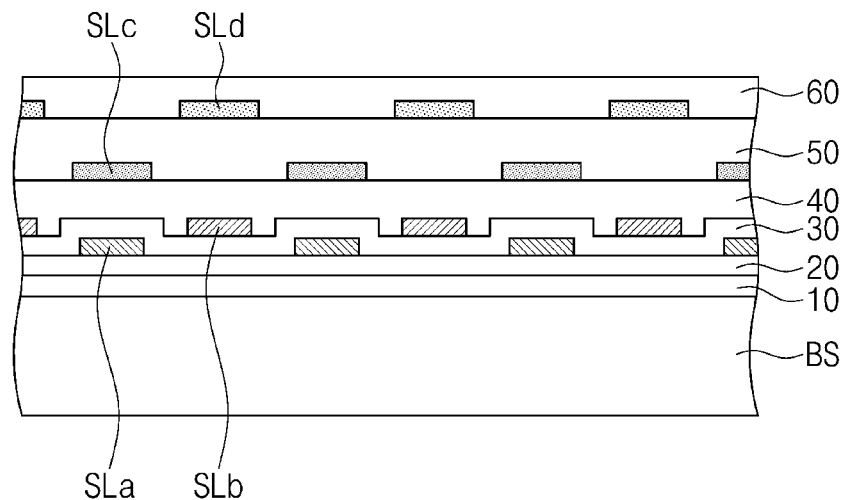
FIG. 13A is a cross-sectional view taken along the sectional line I-I' illustrated in FIG. 5.
Figure 13B:
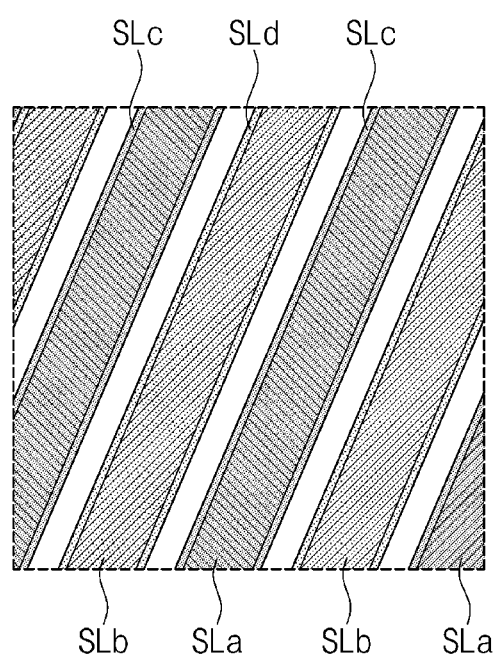
FIG. 13B is an enlarged plan view of the YY' region illustrated in FIG. 5.

FIG. 13A is a cross-sectional view cut along a region corresponding to sectional line I-I' illustrated in FIG. 5. FIG. 13B is an enlarged plan view of a region corresponding to YY' region illustrated in FIG. 5.

In relation to FIGS. 13A and 13B, the third line SLc may be disposed on the first line SLa, and the fourth line SLd may be disposed on the second line SLb. Accordingly, in a planar view, the first line SLa and the third line SLc may overlap each other, and the second line SLb and the fourth line SLd may overlap each other. The overlapping first line SLa and third line SLc, and the overlapping second line SLb and fourth line SLd may be periodically alternately repeated and arrayed in the above sequence. According exemplary embodiments illustrated in FIGS. 13A and 13B, in comparison with the embodiments illustrated in FIGS. 11A and 12A, the area of the second region AR2 may be further reduced on the plane.

Figure 14A:
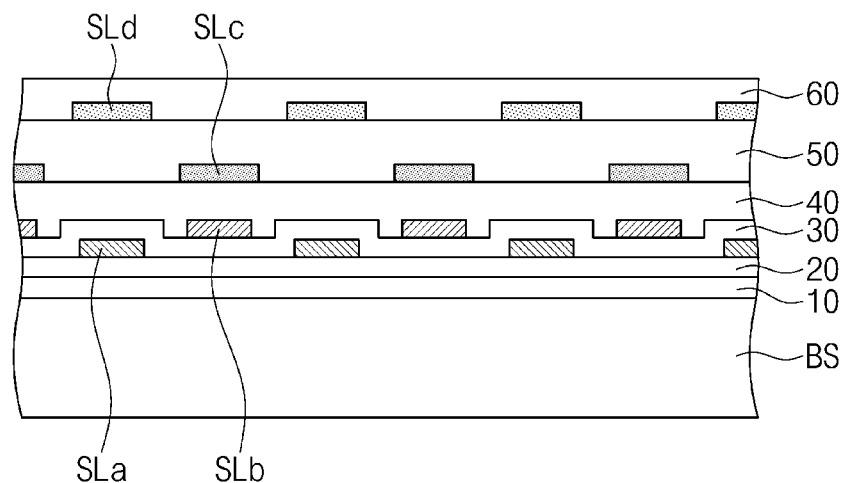
FIG. 14A is a cross-sectional view taken along the sectional line I-I' illustrated in FIG. 5.
Figure 14B:
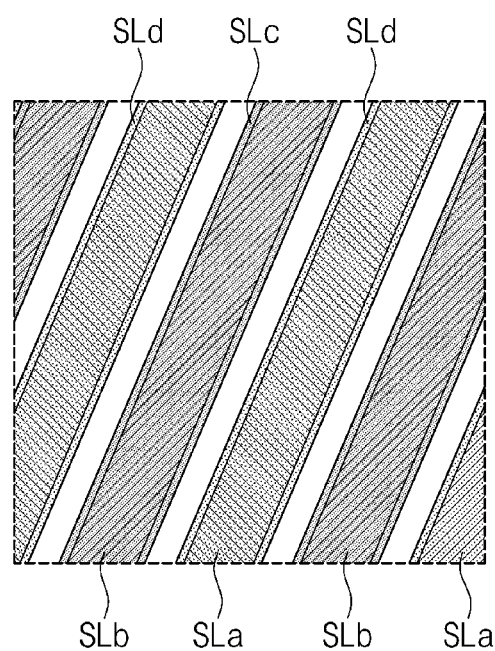
FIG. 14B is an enlarged plan view of the YY' region illustrated in FIG. 5.

FIG. 14A is a cross-sectional view cut along a region corresponding to sectional line I-I' illustrated in FIG. 5. FIG. 14B is an enlarged plan view of a region corresponding to YY' region illustrated in FIG. 5.

In relation to FIGS. 14A and 14B, the third line SLc may be disposed on the second line SLb, and the fourth line SLd may be disposed on the first line SLa. Accordingly, in a planar view, the second line SLb and the third line SLc may overlap each other, and the first line SLa and the fourth line SLd may overlap each other. The overlapping first line SLa and fourth line SLd, and the overlapping second line SLb and third line SLc may be periodically and alternately repeated and arrayed in the above sequence.

Figure 15:
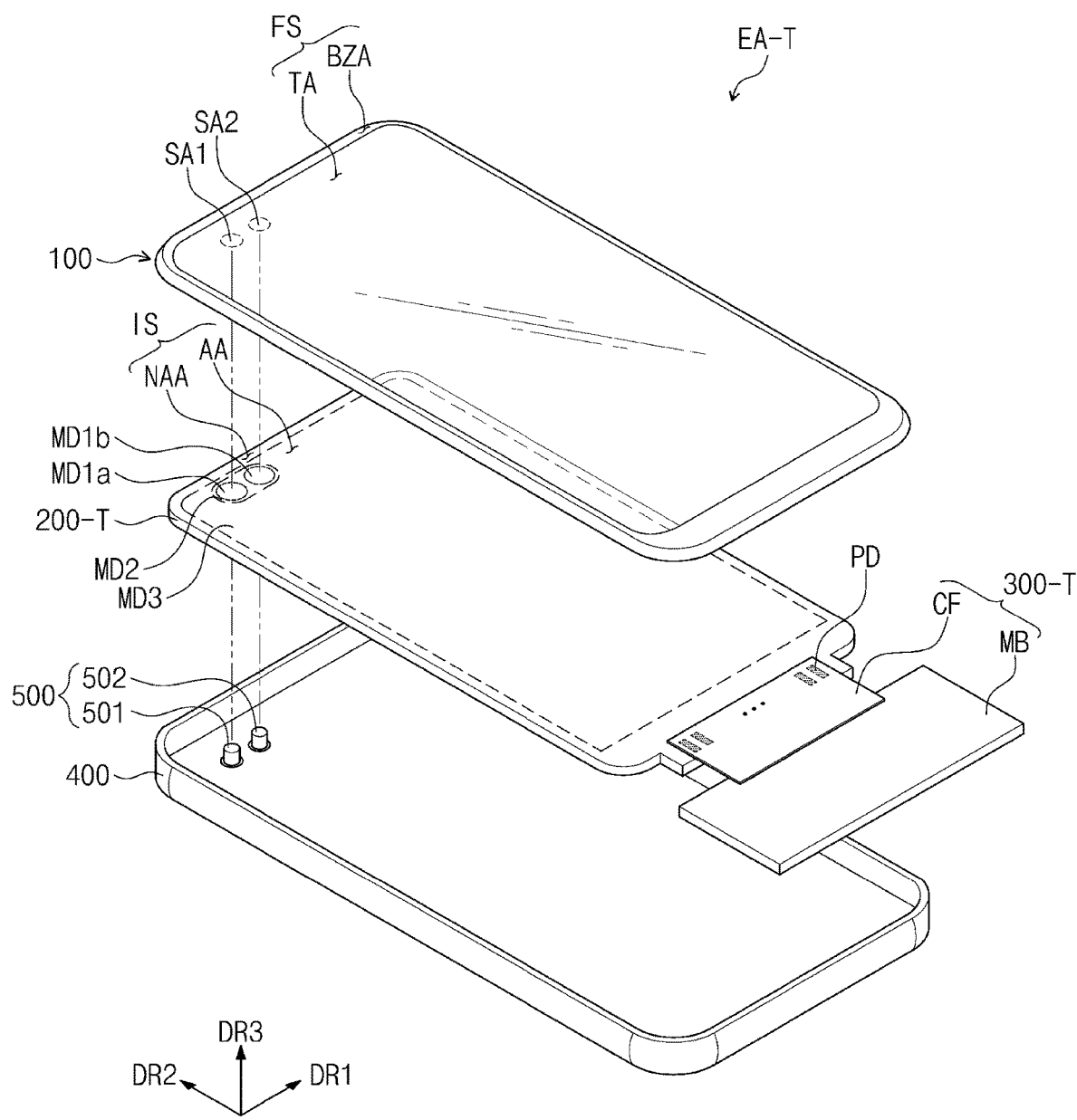
FIG. 15 is an exploded perspective view of a display device according to an exemplary embodiment.

FIG. 15 is an exploded perspective view of a display device according to an exemplary embodiment. In description about FIG. 15, a part having a difference with FIG. 1B will be described, like reference numerals are imparted to the same components as those described in relation to FIG. 1B and a repeated description thereabout will be omitted.

In relation to FIG. 15, a display device EA-T may include a window 100, a display module 200_T, a driving circuit unit 300-T, a housing 400, and an electronic modules 500.

The display module 200-T may be divided into first module regions MD1a and MD1b, a second module region MD2, and a third module region MD3. The first module regions MD1a and MD1b may be regions corresponding to the first areas AR1a and AR1b of the base layer BS illustrated in FIG. 3A, the second module region MD2 may be a region corresponding to the second region AR2 of the base layer BS, and the third module region MD3 may be a region corresponding to the third area AR3 of the base layer BS.

The first module regions MD1a and MD1b may be regions overlapping the first and second electronic modules 501 and 502 one to one. The transmissivities of the first module regions MD1a and MD1b may be higher than that of the third module region MD3. In order to raise the transmissivities of the first module regions MD1a and MD1b, prescribed components may not be disposed in the first module regions MD1a and MD1b. For example, at least a part of the signal lines SNL1, SNL2, and PL (see FIG. 3A) may be designed not to overlap the first module regions MD1a and MD1b. In an exemplary embodiment, at least a part of components configuring the display module 200-T may not be disposed in the first module regions MD1a and MD1b. For example, at least one of the first electrode E1 (see FIG. 6), the second electrode E2 (see FIG. 6), the light emitting element ELD (see FIG. 6), the transistor TR (see FIG. 6), the first sensing electrode TE1 (see FIG. 4), and the second sensing electrode TE2 (see FIG. 4) may not be disposed in the first module regions MD1a and MD1b.

Accordingly, the first and second electronic modules 501 and 502 may easily and visibly recognize an external subject through the first module regions MD1a and MD1b, or output signals generated by the first and second electronic modules 501 and 502 may be easily transferred externally.

Figure 16:
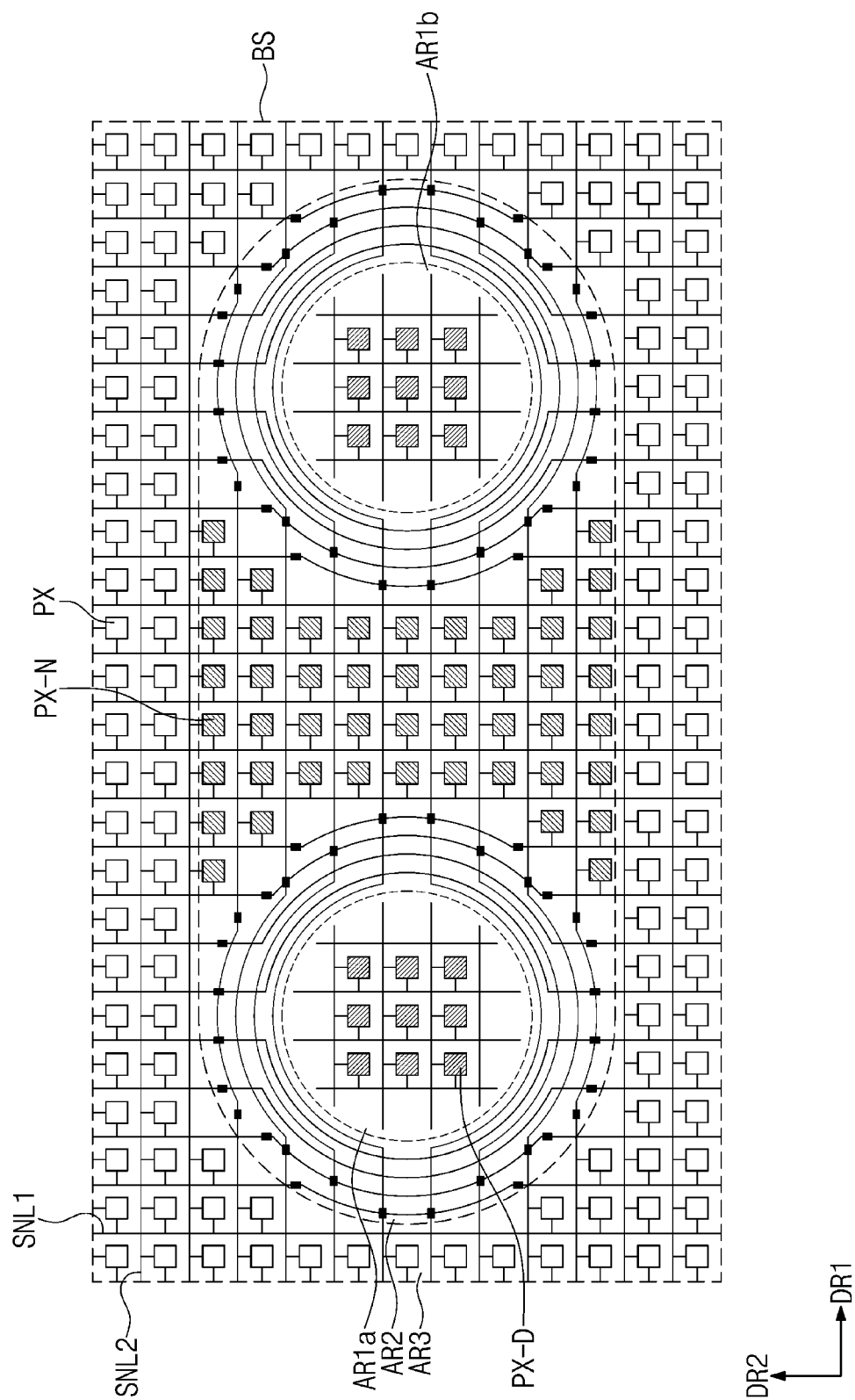
FIG. 16 is an enlarged plan view of a part of the display module in FIG. 15.

FIG. 16 is an enlarged plan view of a part of the display module in FIG. 15.

In relation to FIG. 16, missing pixels PX-D may be disposed on the first regions AR1 and AR1b of the base layer BS. The missing pixels PX-D may be pixels that do not include at least a part of elements of the pixel PX. Accordingly, the transmissivity of a region in which the missing pixels PX-D are disposed may be higher than that in a region in which the pixel PX is disposed. For distinction from the pixels PX, the missing pixels PX-D are shown by hatching.

FIG. 16 exemplarily illustrates that only missing pixels PX-D are disposed in the first regions AR1a and AR1b, but the exemplary embodiment is not limited thereto. For example, in each of the first regions AR1a and AR1b, not only the missing pixels PX-D but typical pixels including the same elements as the pixels PX may be disposed. The ratio between the missing pixels PX-D and the typical pixels may be variously adjusted.

In an exemplary embodiment, a part corresponding to the first regions AR1a and AR1b may be removed through a cutting process later.

Figure 17A:
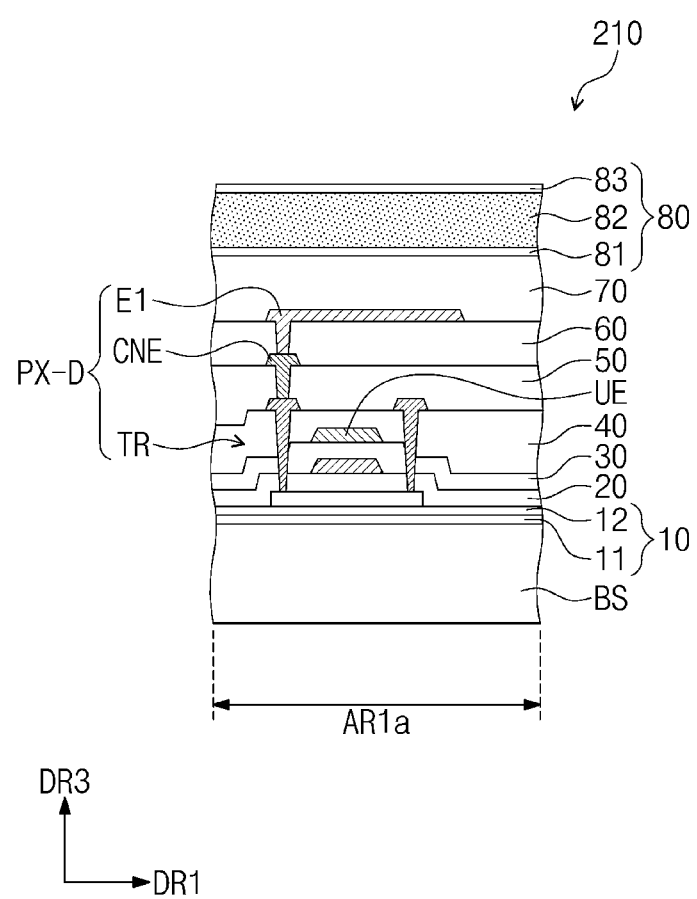
FIG. 17A is a cross-sectional view of a display panel according to an exemplary embodiment.

FIG. 17A is a cross-sectional view of a display panel according to an exemplary embodiment. FIG. 17A is a cross-sectional view of the display panel 210 including the first area AR1a of the base layer BS. FIG. 17A may be a cross-sectional view of a region in which the missing pixel PX-D is disposed.

In comparison with the typical pixel PX (see FIG. 3A), the missing pixel PX-D may not include some elements. Accordingly, the transmissivity of a region in which the missing pixel PX-D is disposed may be higher than that of a region in which the pixel is disposed. For example, the missing pixel PX-D may include the transistor TR, the connection electrode CNE and the first electrode E1, but may not include the emission layer EL (see FIG. 6) and the second electrode E2 (see FIG. 6).

Figure 17B:
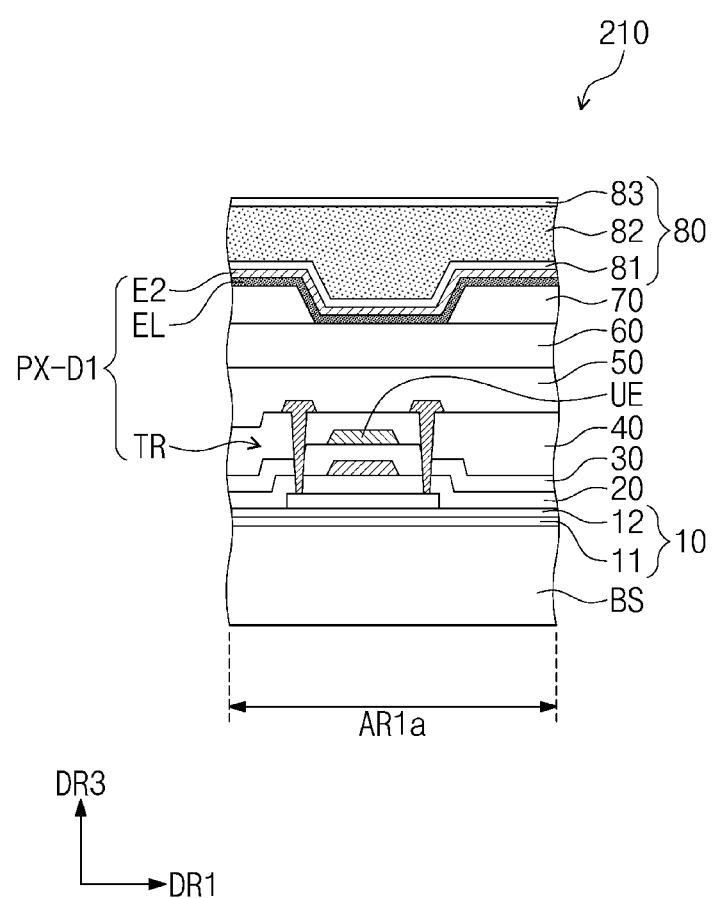
FIG. 17B is a cross-sectional view of a display panel according to an exemplary embodiment.

FIG. 17B is a cross-sectional view of a display panel according to an exemplary embodiment. FIG. 17B is a cross-sectional view of the display panel 210 including the first region AR1a of the base layer BS. FIG. 17B may be a cross-sectional view of a region in which the missing pixel PX-D1 is disposed.

In comparison with the typical pixel PX (see FIG. 3A), the missing pixel PX-D1 may not include some elements. For example, the missing pixel PX-D1 may include the transistor TR, the emission layer EL and the second electrode E2, and may not include the connection electrode CNE (see FIG. 6) and the first electrode E1 (see FIG. 6).

Figure 17C:
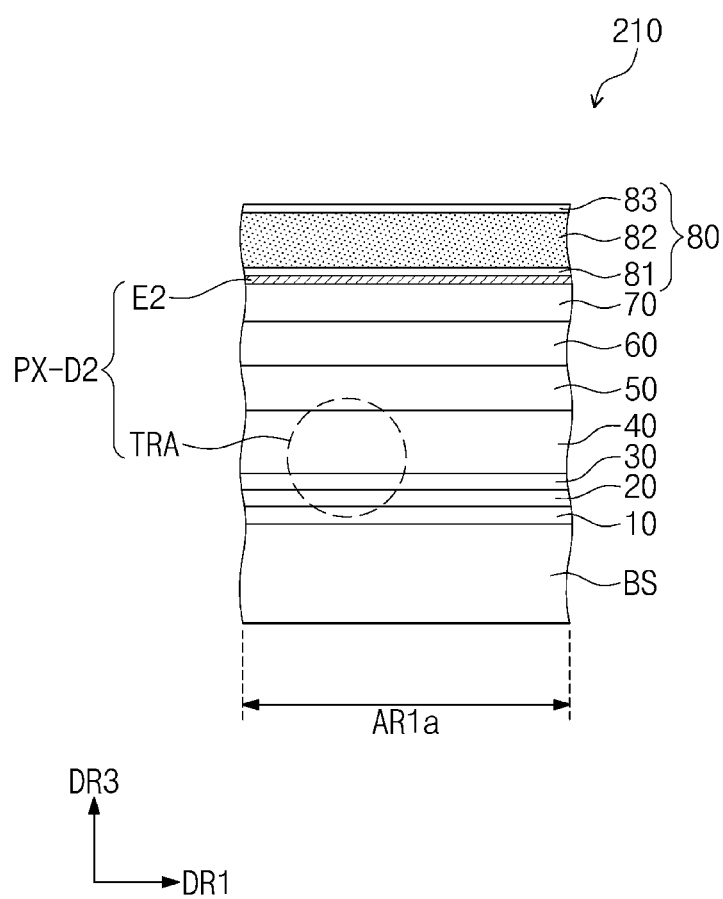
FIG. 17C is a cross-sectional view of a display panel according to an exemplary embodiment.

FIG. 17C is a cross-sectional view of a display panel according to an exemplary embodiment. FIG. 17C is a cross-sectional view of the display panel 210 including the first area AR1a of the base layer BS. FIG. 17C may be a cross-sectional view of a region in which the missing pixel PX-D2 is disposed.

In comparison with the typical pixel PX (see FIG. 3A), the missing pixel PX-D2 may not include some elements. Accordingly, the transmissivity of a region in which the missing pixel PX-D2 is disposed may be higher than that of a region in which the pixel PX is disposed. For example, the missing pixel PX-D2 includes only the second electrode E2. In order to assist the understanding, FIG. 17C shows a region TRA in which the transistor TR (see FIG. 6) is omitted with a dotted line.

In addition, in another exemplary embodiment, the missing pixel PX-D2 may also not include the second electrode E2. In this case, even though an expression that the missing pixel PX-D2 is disposed in the first region AR1a is used, only the base layer BS and the first to eighth insulation layers 10, 20, 30, 40, 50, 60, 70, and 80 may be disposed in the first region AR1a. In an exemplary embodiment, in order to increase the transmissivity of the first region AR1a, at least a part of the base layer BS and the first to eighth insulation layers 10, 20, 30, 40, 50, 60, 70, and 80 may be further omitted.

Figure 18:
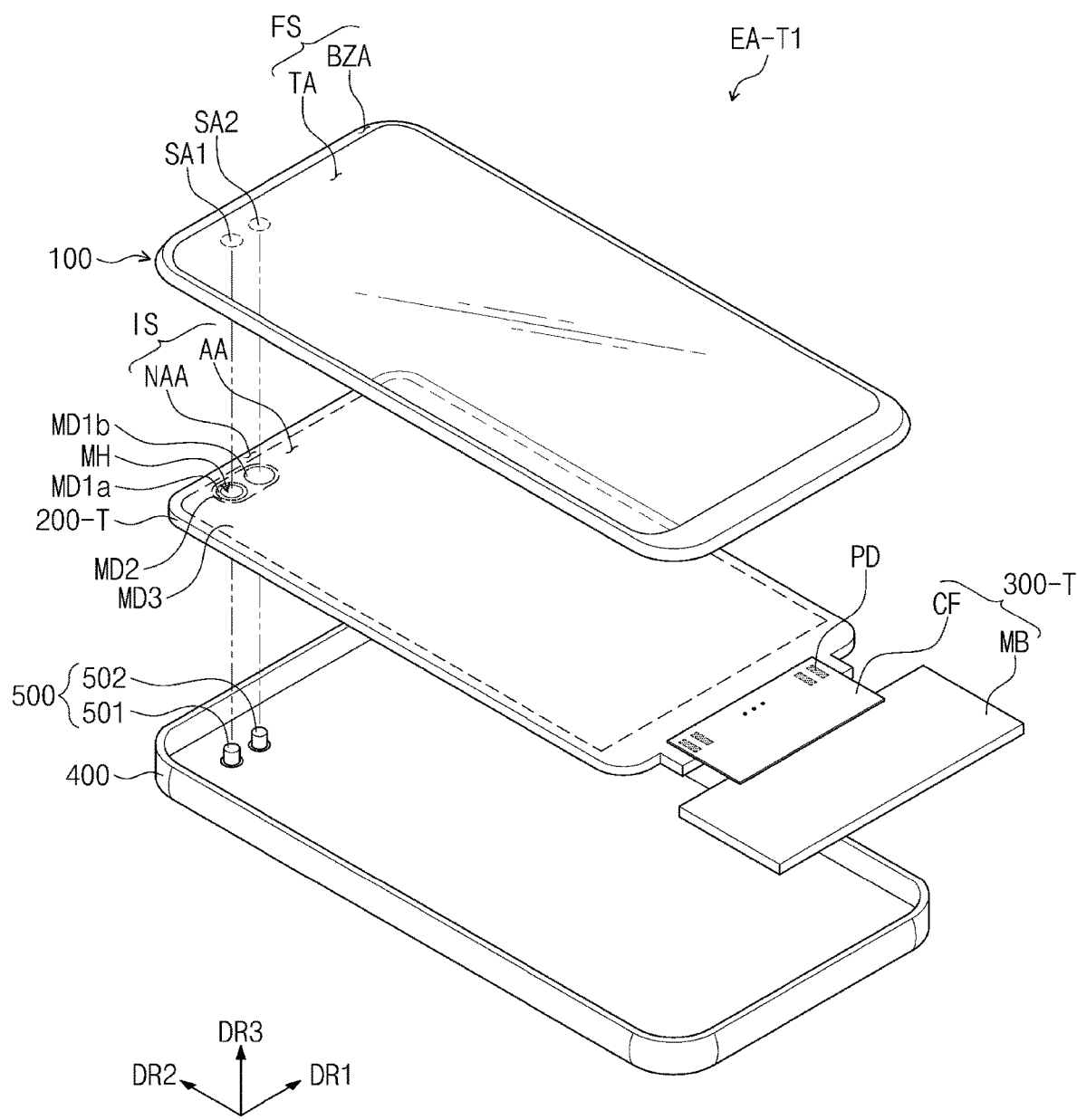
FIG. 18 is an exploded perspective view of a display device according to an exemplary embodiment.

FIG. 18 is an exploded perspective view of a display device according to an exemplary embodiment. In description about FIG. 18, a part having a difference with FIG. 15 will be described, reference numerals are imparted to the same components as those described in relation to FIG. 15, and a repeated description thereabout will be omitted.

In relation to FIG. 18, the display device EA-T1 may include a window 100, a display module 200-T, a driving circuit unit 300-T, a housing 400, and electronic modules 500.

The display module 200-T may be divided into first module regions MD1a and MD1b, a second module region MD2, and a third module region MD3. The first module regions MD1a and MD1b may be regions corresponding to the first areas AR1a and AR1b of the base layer BS illustrated in FIG. 3A, the second module region MD2 may be a region corresponding to the second region AR2 of the base layer BS and the third module region MD3 may be a region corresponding to the third area AR3 of the base layer BS.

The first module regions MD1a and MD1b may be regions overlapping the first and second electronic modules 501 and 502 one to one on a plane. The transmissivities of the first module regions MD1a and MD1b may be higher than that of the third module region MD3. The first module regions MD1a and MD1b may have different transmissivities.

In an exemplary embodiment, a module hole MH may be defined in the first module regions MD1a. The module hole MH may be defined by removing all components of the display module 200-T disposed to overlap the first sensor region SA1. Accordingly, the transmissivity of the first module region MD1a may be higher than that of the first module region MD1b.

The first electronic module 501 disposed to overlap the first module region MD1a may be a camera module, and the second electronic module 502 disposed to overlap the first module region MD1b may be a light emitting module, a light receiving module, or a heat sensing module.

The display device according to exemplary embodiments may include a base layer, and first to fourth lines sequentially disposed on the base layer. The base layer may include a first region, a second region configured to surround the first region, and a third region configured to surround the second region. The first to fourth lines may be disposed on the second region. In a planar view, the first line and the second line may not overlap each other. In a planar view, the third line and the fourth line may not overlap each other. Accordingly, a probability that a parasitic capacitance between adjacent lines would be generated may be reduced. Accordingly, degradation in display quality caused by the parasitic capacitance may be prevented or suppressed.

While this invention has been described with reference to exemplary embodiments thereof, it will be clear to those of ordinary skill in the art to which the invention pertains that various changes and modifications may be made to the described embodiments without departing from the spirit and technical area of the invention as defined in the appended claims and their equivalents. Thus, the scope of the inventive concepts shall not be restricted or limited by the foregoing description, but be determined by the broadest permissible interpretation of the following claims.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a base layer comprising: a first region in which a hole is defined; a second region configured to surround the first region; and a third region configured to surround the second region;
a line part disposed on the second region, the line part comprising a first line, a second line, a third line, and a fourth line disposed on different layers from each other;
pixels disposed on the third region;
first signal lines electrically connected to the pixels, the first signal lines arrayed along a first direction; and
second signal lines electrically connected to the pixels, the second signal lines arrayed along a second direction that intersects with the first direction,
wherein one second signal line of the second signal lines is electrically connected to the first line, another second signal line of the second signal lines is electrically connected to the second line, one first signal line of the first signal lines is electrically connected to the third line, and another first signal line of the first signal lines is electrically connected to the fourth line,
wherein the first, the second line, the third line, and the fourth line are sequentially disposed on the base layer, and
wherein, in a planar view, the first line and the second line do not overlap, and the third line and the fourth line do not overlap.

2. The display device of claim 1, further comprising:
a first insulation layer disposed between the first line and the second line;
a second insulation layer disposed between the second line and the third line; and
a third insulation layer disposed between the third line and the fourth line,
wherein the first line, the first insulation layer, the second line, the second insulation layer, the third line, the third insulation layer, and the fourth line are sequentially disposed on the base layer.

3. The display device of claim 2, wherein each of the pixels comprises:
a transistor comprising:
a control electrode disposed on an identical layer on which the first line is disposed; and
an output electrode and an input electrode disposed on an identical layer on which the third line is disposed;
a connection electrode disposed on an identical layer on which the fourth line is disposed; and
a light emitting element electrically connected to the connection electrode.

4. The display device of claim 1, wherein the second line is disposed between a layer on which the first line is disposed and a layer on which the third line is disposed, and the third line is disposed between a layer on which the second line is disposed and a layer on which the fourth line is disposed.

5. The display device of claim 1, wherein, in the planar view, the first, second, third, and fourth lines are repeatedly arranged in a sequence of the first line, the third line, the second line, and the fourth line.

6. The display device of claim 1, wherein, in the planar view, a part of the third line overlaps a part of the first line, and another part of the third line overlaps a part of the second line.

7. The display device of claim 6, wherein, in the planar view, a part of the fourth line overlaps another part of the first line, and another part of the fourth line overlaps another part of the second line.

8. The display device of claim 1, wherein, in the planar view, the third line overlaps one of the first line and the second line, and the fourth line overlaps the other one of the first line and the second line.

9. The display device of claim 1, wherein, in the planar view, the first, second, third, and fourth lines are repeatedly arranged in a sequence of the second line, the third line, the first line, and the fourth line.

10. The display device of claim 1, wherein the first region comprises a plurality of first regions, each of the plurality of first regions being disposed separately, and
wherein the second region surrounds the plurality of first regions.

11. The display device of claim 10, further comprising:
non-light emitting pixels disposed on the second region between the plurality of first regions.

12. A display device comprising:
a base layer comprising: a first region in which a hole is defined; a second region configured to surround the first region; and a third region configured to surround the second region;
pixels disposed on the third region;
first signal lines electrically connected to the pixels;
second signal lines electrically connected to the pixels;
a first line disposed on the second region and electrically connected to one second signal line of the second signal lines;
a second line disposed on the second region and electrically connected to another second signal line of the second signal lines;
a third line disposed on the second region and electrically connected to one first signal line of the first signal lines; and
a fourth line disposed on the second region and electrically connected to another first signal line of the first signal lines,
wherein the first line, the second line, the third line, and the fourth line are disposed on different layers, and
wherein the second line is disposed on a layer between the first line and the third line, the third line is disposed on a layer between the second line and the fourth line, and, in a planar view, the first line does not overlap the second line, and the third line does not overlap the fourth line.

13. The display device of claim 12, wherein, in the planar view, the first, second, third, and fourth lines are repeatedly arranged in a sequence of the first line, the third line, the second line, and the fourth line.

14. The display device of claim 12, wherein, in the planar view, a part of the third line overlaps a part of the first line, and another part of the third line overlaps a part of the second line, and
in the planar view, a part of the fourth line overlaps another part of the first line, and another part of the fourth line overlaps another part of the second line.

15. The display device of claim 12, wherein, in the planar view, the third line overlaps one of the first line and the second line, and the fourth line overlaps the other one of the first line and the second line.

16. The display device of claim 12, wherein the base layer, the pixels, the first signal lines, the second signal lines, and the first, second, third, and fourth lines constitute a display module, the display module comprising:

a first module region defined to overlap the first region, a second module region defined to overlap the second region, and a third module region defined to overlap the third region, and wherein transmittance of the first module region is higher than transmittance of the third module region.

17. A display device comprising:

a display panel in which a non-display region and a display region configured to surround the non-display region are defined, the display panel comprising:

a base layer in which a hole is defined in a region configured to correspond to the non-display region;

a line part disposed on a peripheral region of the hole of the base layer, the line part comprising a first line, a second line, a third line, and a fourth line disposed on different layers from each other; and a pixel electrically connected to the line part, wherein the first line, the second line, the third line, and the fourth line are sequentially disposed on the base layer, and wherein, in a planar view, the first line and the second line do not overlap, and the third line and the fourth line do not overlap.

18. The display device of claim 17, wherein the second line is disposed between a layer on which the first line is disposed and a layer on which the third line is disposed, and the third line is disposed between a layer on which the second line is disposed and a layer on which the fourth line is disposed.

19. The display device of claim 17, wherein, in the planar view, a part of the third line overlaps a part of the first line, and another part of the third line overlaps a part of the second line, and in the planar view, a part of the fourth line overlaps another part of the first line, and another part of the fourth line overlaps another part of the second line.

20. A display device comprising:

a display panel including a non-display region and a display region configured to surround the non-display region, the non-display region comprising: a first region in which a hole is defined; and a second region configured to surround the first region, the display panel comprising:

a line part disposed in the second region and comprising first line parts and second line parts disposed on different layers from each other;

pixels disposed in the display region;

first signal lines disposed in the display region, the first signal lines arrayed along a first direction, and the first signal lines electrically connected to the pixels and the first line parts; and second signal lines disposed in the display region, the second signal lines arrayed along a second direction that intersects with the first direction, and the second signal lines electrically connected to the pixels and the second line parts, wherein, in a planar view, one of the first line parts is disposed in a region between two adjacent second line parts and among the second line parts.

21. The display device of claim 20, wherein the first line parts comprise a first line and a second line disposed on different layers from each other, and wherein the second line parts comprise a third line and a fourth line disposed on different layers from each other.

22. The display device of claim 21, wherein the third line is disposed on a layer between the second line and the fourth line.

* * * * *